United States Patent
Shimoyama et al.

(10) Patent No.: US 10,633,757 B2
(45) Date of Patent: Apr. 28, 2020

(54) PLATING APPARATUS, PLATING METHOD, AND RECORDING MEDIUM

(71) Applicant: EBARA CORPORATION, Tokyo (JP)

(72) Inventors: Masashi Shimoyama, Tokyo (JP); Yuji Araki, Tokyo (JP); Mizuki Nagai, Tokyo (JP); Jumpei Fujikata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 32 days.

(21) Appl. No.: 16/307,908

(22) PCT Filed: Apr. 14, 2017

(86) PCT No.: PCT/JP2017/015215
§ 371 (c)(1),
(2) Date: Dec. 6, 2018

(87) PCT Pub. No.: WO2017/212785
PCT Pub. Date: Dec. 14, 2017

(65) Prior Publication Data
US 2019/0309436 A1    Oct. 10, 2019

(30) Foreign Application Priority Data
Jun. 7, 2016 (JP) ................. 2016-113500

(51) Int. Cl.
*C25D 21/12* (2006.01)
*C25D 7/12* (2006.01)
(Continued)

(52) U.S. Cl.
CPC .............. *C25D 21/12* (2013.01); *C25D 7/12* (2013.01); *C25D 17/00* (2013.01); *H01L 21/2885* (2013.01)

(58) Field of Classification Search
CPC ................. C25D 7/12–126; C25D 17/001
See application file for complete search history.

(56) References Cited

U.S. PATENT DOCUMENTS 5,478,454 A * 12/1995 Inoue ............... C25D 13/22
204/482
2003/0085132 A1* 5/2003 Cobley .............. C25D 3/02
205/263
(Continued)

FOREIGN PATENT DOCUMENTS

JP    04-044377 U1    4/1992
JP    2510422 B2     6/1996
(Continued)

OTHER PUBLICATIONS

International Patent Application No. PCT/JP2017/015215; Int'l Search Report; dated May 30, 2017; 2 pages.

*Primary Examiner* — Brian W Cohen
*Assistant Examiner* — Ho-Sung Chung
(74) *Attorney, Agent, or Firm* — BakerHostetler

(57) ABSTRACT

There are provided a plating apparatus and a plating method that allow determining an appropriate replacement timing of a diaphragm. The plating apparatus includes an anode bath, a cathode bath, a diaphragm, an analyzer, and a control device. The anode bath holds a plating solution and an insoluble anode. The cathode bath holds a plating solution containing an additive and a substrate. The diaphragm separates the plating solution held in the anode bath from the plating solution held in the cathode bath. The analyzer is configured to analyze a concentration of the additive in the plating solution in the cathode bath at every predetermined time interval. The control device is configured to calculate an actual consumption of the additive during the predetermined period based on the concentration of the additive analyzed at the every predetermined time interval. The control device includes a memory that stores an expected consumption of the additive during the predetermined period. The control device is configured to determine (Continued)

whether a difference between the actual consumption and the expected consumption is equal to or more than a predetermined value or not.

8 Claims, 15 Drawing Sheets

(51) Int. Cl.
*H01L 21/288* (2006.01)
*C25D 17/00* (2006.01)

(56) References Cited

U.S. PATENT DOCUMENTS

2014/0360865 A1  12/2014  Kimura et al.
2016/0369421 A1  12/2016  Yahagi et al.

FOREIGN PATENT DOCUMENTS

| | | |
|---|---|---|
| JP | 2002-097597 A | 4/2002 |
| JP | 2004-176116 A | 6/2004 |
| JP | 2014-237865 A | 12/2014 |
| WO | WO 2015/119182 A1 | 8/2015 |

* cited by examiner

PLATING APPARATUS, PLATING METHOD, AND RECORDING MEDIUM

TECHNICAL FIELD

The present invention relates to a plating apparatus and a plating method that plate a substrate such as a semiconductor wafer.

BACKGROUND ART

Conventionally, wiring is formed on fine grooves for wiring, holes, or resist openings provided on a surface of a substrate such as a semiconductor wafer, and bumps (protruding electrode) electrically connected to electrodes of a package or similar component is formed on the surface of the substrate. As such method for forming these wiring and bump, a method such as an electrolytic plating method, a deposition method, a printing method, and a ball bump method has been known. In accordance with recent increase in the number of I/Os of a semiconductor chip and recent decrease in pitch, the electrolytic plating method that allows miniaturization and provides comparatively stable performance has been often used.

In an apparatus performing the electrolytic plating, an anode and a substrate are generally disposed so as to be mutually opposed in a plating bath that houses plating solution, and a voltage is applied to the anode and the substrate. This forms a plating film on the substrate surface.

When the plating film is formed by the electrolytic plating method, various kinds of additives are generally mixed with the plating solution. Mixing the additive with the plating solution allows obtaining, for example, an effect of promoting or reducing the film formation speed of the plating film and an effect of improving the film quality of the plating film.

As the anode used by the electrolytic plating apparatus, there has been conventionally used a soluble anode that dissolves in plating solution and an insoluble anode that does not dissolve in the plating solution. Usually, when the plating film is formed on the substrate, the additive is adsorbed into and consumed by the plating film. In addition, performing a plating process using the insoluble anode generates oxygen by a reaction of the insoluble anode with the plating solution and the additive reacts with this oxygen to be decomposed. Additionally, the additive is also decomposed through a contact with the insoluble anode. The decomposition of the additive causes the additive to lose the above-described effects, causing a problem that the desired film cannot be obtained on the substrate surface. To prevent this problem, it is only necessary to add the additive to the plating solution as needed such that the concentration of the additive in the plating solution is maintained at a certain level or more. However, since the additive is expensive, the decomposition of the additive is desirably reduced as much as possible.

CITATION LIST

Patent Literature

PTL 1: Japanese Patent No. 2510422
PTL 2: Japanese Unexamined Utility Model Application Publication No. 4-44377
PTL 3: Japanese Unexamined Patent Application Publication No. 2014-237865

SUMMARY OF INVENTION

Technical Problem

To reduce a problem such as a decomposition of additive in a plating apparatus using an insoluble anode, a plating bath (anode bath) housing an anode and a plating bath (cathode bath) housing a cathode are separated by a neutral diaphragm (for example, see PTL 1 and PTL 2). In a plating apparatus using a soluble anode, an anode bath and a cathode bath are separated by the use of a multilayer-structured cation exchange membrane that permits transmission of metal ions and hinders transmission of nonionic organic additive as a diaphragm (for example, see PTL 3). Thus separating the anode bath and the cathode bath by the diaphragm having micropores smaller than an average size of molecules constituting the additive reduces a movement of the additive contained in plating solution in the cathode bath into the anode bath, thereby reducing the decomposition of the additive by the contact of the additive with oxygen.

The deterioration of the diaphragm such as the neutral diaphragm or the cation exchange membrane progresses in accordance with the progress of the plating process. The progress of the deterioration of the diaphragm is likely to move the additive contained in the plating solution in the cathode bath to the anode bath. Also in the case where the diaphragm is physically damaged, the additive is likely to move to the anode bath. Therefore, to reduce the decomposition of the additive, replacing the diaphragm at an appropriate timing is required. However, the level of progress of the deterioration of the diaphragm is different depending on the content of the plating process. Further, there may be a case where the diaphragm is physically damaged incidentally regardless of the progress of the deterioration of the diaphragm. Accordingly, replacing the diaphragm at the appropriate timing was difficult.

There is a case where the diaphragm is desirably continuously used without the replacement. Especially, in the use of the soluble anode as the anode, the cation exchange membrane, which is comparatively high cost, is often used as the diaphragm that separates the anode bath from the cathode bath. Generally, when this cation exchange membrane is physically damaged, the damage can be possibly confirmed by visual check or similar method. However, even without the physical damage, for example, when the micropores on the diaphragm are clogged, confirming this clogging by visual check or similar method was comparatively difficult. Accordingly, this diaphragm was not able to be cleaned and regenerated at the appropriate timing conventionally.

The present invention has been made in consideration of the above-described problems and one object of the present invention is to provide a plating apparatus and a plating method that can determine an appropriate replacement timing of a diaphragm, and a recording medium that causes the plating apparatus to perform the plating method.

Another object of the present invention is to provide a plating apparatus and a plating method that can appropriately regenerate or clean the diaphragm.

Solution to Problem

According to one aspect of the present invention, there is provided a plating apparatus. This plating apparatus includes an anode unit, a cathode unit, a diaphragm, and at least one of a liquid surface level sensor and an analyzer. The anode unit holds a plating solution and an anode. The cathode unit is disposed so as to at least partially contact the anode unit. The cathode unit holds a plating solution containing an additive and a substrate. The diaphragm is disposed between the anode unit and the cathode unit. The liquid surface level sensor is configured to sense a liquid surface level of the plating solution in the anode unit. The analyzer is configured to analyze a concentration of the additive in the plating solution in the cathode unit at every predetermined time interval. A presence/absence of an abnormality in the diaphragm is determined based on at least one of information on whether the liquid surface level sensed by the liquid surface level sensor is equal to or less than a predetermined level or not and concentration information of the additive analyzed at the every predetermined time interval by the analyzer.

According to one aspect of the present invention, the plating apparatus includes a control device configured to receive the information on the concentration of the additive analyzed at the every predetermined time interval. The control device is configured to calculate an actual consumption of the additive during the predetermined period based on the information on the concentration of the additive. The control device includes a memory. The memory stores an expected consumption of the additive during the predetermined period. The control device is configured to determine whether a difference between the actual consumption and the expected consumption is equal to or more than a predetermined value or not.

According to one aspect of the present invention, the expected consumption is determined according to parameters regarding an electrolytic volume during the predetermined period and a length of the predetermined period.

According to one aspect of the present invention, the plating apparatus includes a control device configured to receive information on a presence/absence of the substrate and information on the liquid surface level sensed by the liquid surface level sensor. The control device is configured to determine whether the substrate is present in the cathode unit or not and whether the liquid surface level sensed by the liquid surface level sensor is equal to or less than the predetermined level or not based on the information on the liquid surface level.

According to one aspect of the present invention, the plating apparatus includes an alarm device configured such that when the substrate is absent in the cathode unit and the control device determines that the liquid surface level sensed by the liquid surface level sensor is equal to or less than the predetermined level, the alarm device activates an alarm on the abnormality in the diaphragm.

According to one aspect of the present invention, the anode unit has an opening for diaphragm on a side surface thereof. The diaphragm is disposed at the anode unit so as to cover the opening for diaphragm. The diaphragm is replaceable together with the anode unit.

According to one aspect of the present invention, the anode unit includes a hole and a valve. The hole is provided on a wall surface constituting the anode unit. The valve opens and closes the hole from an inside of the anode unit. The anode unit is housed in the cathode unit.

According to one aspect of the present invention, the plating apparatus includes an arithmetic unit configured to receive a plurality of data. The plurality of data indicate a time interval from when the diaphragm is mounted to the plating apparatus until the diaphragm is replaced. The arithmetic unit is configured to determine a replacement timing of the diaphragm based on the data.

According to one aspect of the present invention, there is provided a plating method that plates a substrate by a plating apparatus. The plating apparatus separates a plating solution in an anode unit housing an anode from a plating solution containing an additive in a cathode unit housing the substrate with a diaphragm. This plating method includes: a step of analyzing a concentration of the additive in the plating solution in the cathode unit at every predetermined time interval; a step of calculating an actual consumption of the additive during the predetermined period based on the concentration of the additive analyzed at the every predetermined time interval; a step of determining whether a difference between an expected consumption and the actual consumption of the additive during the predetermined period is equal to or more than a predetermined value or not; and a step of replacing the diaphragm when the difference between the expected consumption and the actual consumption is determined as equal to or more than the predetermined value.

According to one aspect of the present invention, the plating method includes a step of determining the expected consumption according to parameters regarding an electrolytic volume during the predetermined period and a length of the predetermined period.

According to one aspect of the present invention, there is provided a plating method that plates a substrate by a plating apparatus. The plating apparatus separates a plating solution in an anode unit housing an anode from a plating solution containing an additive in a cathode unit housing the substrate with a diaphragm. This plating method includes: a step of sensing a liquid surface level of the plating solution in the anode unit; a step of determining whether the liquid surface level is equal to or less than a predetermined level or not; a step of determining whether the substrate is present in the cathode unit or not; and a step of replacing the diaphragm when the substrate is determined as absent in the cathode unit and the liquid surface level is determined as equal to or less than the predetermined level based on information on whether the substrate is present in the cathode unit or not and information on whether the liquid surface level is equal to or less than the predetermined level or not.

According to one aspect of the present invention, there is provided a plating method that plates a substrate by a plating apparatus. The plating apparatus separates a plating solution in an anode unit housing an anode from a plating solution containing an additive in a cathode unit housing the substrate with a diaphragm. This plating method includes: a step of analyzing a concentration of the additive in the plating solution in the cathode unit at every predetermined time interval; a step of calculating an actual consumption of the additive during the predetermined period based on the concentration of the additive analyzed at the every predetermined time interval; a step of determining whether a difference between an expected consumption and the actual consumption of the additive during the predetermined period is equal to or more than a predetermined value or not; a step of sensing a liquid surface level of the plating solution in the anode unit when the difference between the expected consumption and the actual consumption is determined as equal to or more than the predetermined value; a step of determining whether the liquid surface level is equal to or less than a predetermined level or not; a step of determining whether the substrate is present in the cathode unit or not; and a step of replacing the diaphragm when the substrate is determined as absent in the cathode unit and the liquid surface level is determined as equal to or less than the predetermined level.

According to one aspect of the present invention, there is provided a plating method that plates a substrate by a plating apparatus. The plating apparatus separates a plating solution in an anode unit housing an anode from a plating solution containing an additive in a cathode unit housing the substrate with a diaphragm. This plating method includes: a step of measuring a current value and a voltage value during the plating on the substrate: a step of analyzing a concentration of the additive in the plating solution in the cathode unit at every predetermined time interval; a step of calculating an actual consumption of the additive during the predetermined period based on the concentration of the additive analyzed at the every predetermined time interval; a step of determining whether a difference between an expected consumption and the actual consumption of the additive during the predetermined period is equal to or more than a predetermined value or not; a step of determining whether a difference between a ratio of the voltage value to a current density value calculated based on the current value and a reference value is equal to or more than a predetermined value or not when the difference between the expected consumption and the actual consumption is determined as equal to or more than the predetermined value; and a step of replacing the diaphragm when the difference between the ratio and the reference value is determined as equal to or more than the predetermined value.

According to one aspect of the present invention, there is provided a plating method that plates a substrate by a plating apparatus. The plating apparatus separates a plating solution in an anode unit housing an insoluble anode from a plating solution containing an additive in a cathode unit housing the substrate with a diaphragm. This plating method includes: a step of measuring a current value and a voltage value during the plating on the substrate; a step of determining whether a difference between a ratio of the voltage value to a current density value calculated based on the current value and a reference value is equal to or more than a predetermined value or not; a step of sensing a liquid surface level of the plating solution in the anode unit when the difference is determined as equal to or more than the predetermined value; a step of determining whether the liquid surface level is equal to or less than a predetermined level or not; a step of determining whether the substrate is present in the cathode unit or not; and a step of replacing the diaphragm when the substrate is determined as absent in the cathode unit and the liquid surface level is determined as equal to or less than the predetermined level.

According to one aspect of the present invention, there is provided a plating method that plates a substrate by a plating apparatus. The plating apparatus separates a plating solution in an anode unit housing an insoluble anode from a plating solution containing an additive in a cathode unit housing the substrate with a diaphragm. This plating method includes: a step of measuring a current value and a voltage value during the plating on the substrate; a step of analyzing a concentration of the additive in the plating solution in the cathode unit at every predetermined time interval; a step of determining whether a difference between a ratio of the voltage value to a current density value calculated based on the current value and a reference value is equal to or more than a predetermined value or not; a step of calculating an actual consumption of the additive during the predetermined period based on the concentration of the additive analyzed at the every predetermined time interval when the difference is determined as equal to or more than the predetermined value; a step of determining whether a difference between an expected consumption and the actual consumption of the additive during the predetermined period is equal to or more than a predetermined value or not; and a step of replacing the diaphragm when the difference between the expected consumption and the actual consumption is determined as equal to or more than the predetermined value.

According to one aspect of the present invention, the plating method includes a step of setting a value of the ratio of the voltage value to the current density value immediately after the diaphragm is replaced as the reference value.

According to one aspect of the present invention, the step of replacing the diaphragm includes a step of replacing the diaphragm together with the anode unit.

According to one aspect of the present invention, the plating method further includes: a step of determining a replacement timing of the diaphragm based on a plurality of data, the plurality of data indicating a time interval from when the diaphragm is mounted to the plating apparatus until the diaphragm is replaced; and a step of replacing the diaphragm based on the replacement timing.

According to one aspect of the present invention, there is provided a recording medium storing a computer program. The computer program causes a plating apparatus to perform any one of the above-described plating methods. The plating method that this recording medium causes the plating apparatus to perform further includes: a step of determining a replacement timing of the diaphragm based on a plurality of data, the plurality of data indicating a time interval from when the diaphragm is mounted to the plating apparatus until the diaphragm is replaced; and a step of replacing the diaphragm based on the replacement timing.

According to one aspect of the present invention, there is provided a plating method for plating a substrate. This plating method includes: a step of immersing the substrate in a plating solution containing an additive housed in a cathode unit; a step of immersing a soluble anode in an anode unit housing a plating solution and separated from the cathode unit with a cation exchange membrane; a step of applying a voltage between the soluble anode and the substrate; and a step of regenerating the cation exchange membrane by immersing an electrode different from the substrate in the plating solution containing the additive housed in the cathode unit and applying a voltage between the soluble anode and the electrode.

According to one aspect of the present invention, there is provided a plating method for plating a substrate. This plating method includes: a step of immersing the substrate in a plating solution containing an additive housed in a cathode unit; a step of immersing a soluble anode in an anode unit disposed so as to at least partially contact the cathode unit, housing a plating solution, and separated from the cathode unit with a cation exchange membrane; a step of applying a voltage between the soluble anode and the substrate; a step of determining a presence/absence of abnormality in the cation exchange membrane; and a step of regenerating the cation exchange membrane when the cation exchange membrane is determined as abnormal, by immersing an electrode different from the substrate in the plating solution containing the additive housed in the cathode unit and applying a voltage between the soluble anode and the electrode.

According to one aspect of the present invention, there is provided a plating apparatus. This plating apparatus includes an anode unit, a cathode unit, a diaphragm, a control device, and a diaphragm regenerating apparatus. The anode unit houses a first electrolyte. The anode unit immerses a soluble anode in the first electrolyte. The cathode unit houses a second electrolyte containing an additive as a constituent. The cathode unit is disposed so as to at least partially contact the anode unit. The cathode unit holds a substrate at a position opposed to the soluble anode. The diaphragm is configured so as to separate the first electrolyte housed in the anode unit from the second electrolyte housed in the cathode unit. The diaphragm has a function to permit a transmission of metal ions and block a transmission of the additive. The control device is configured to determine whether the diaphragm is abnormal or not. The diaphragm regenerating apparatus is configured to clean or regenerate the diaphragm.

According to one aspect of the present invention, the plating apparatus includes an analyzer configured to analyze a concentration of metal ions to be plated in the second electrolyte in the cathode unit.

According to one aspect of the present invention, the diaphragm regenerating apparatus includes a first electrode, a second electrode, and a power supply. The first electrode is immersed in the first electrolyte housed in the cathode unit. The second electrode is immersed in the second electrolyte housed in the anode unit. The power supply is configured to apply a voltage between the first electrode and the second electrode such that a current in a direction opposite to a direction during a plating process flows between the first electrode and the second electrode.

Advantageous Effects of Invention

One present invention can provide a plating apparatus and a plating method that can determine an appropriate replacement timing of a diaphragm, and a recording medium that causes the plating apparatus to perform the plating method.

Another one present invention can provide a plating apparatus and a plating method that can appropriately regenerate or clean the diaphragm.

DESCRIPTION OF EMBODIMENTS

Figure 1:
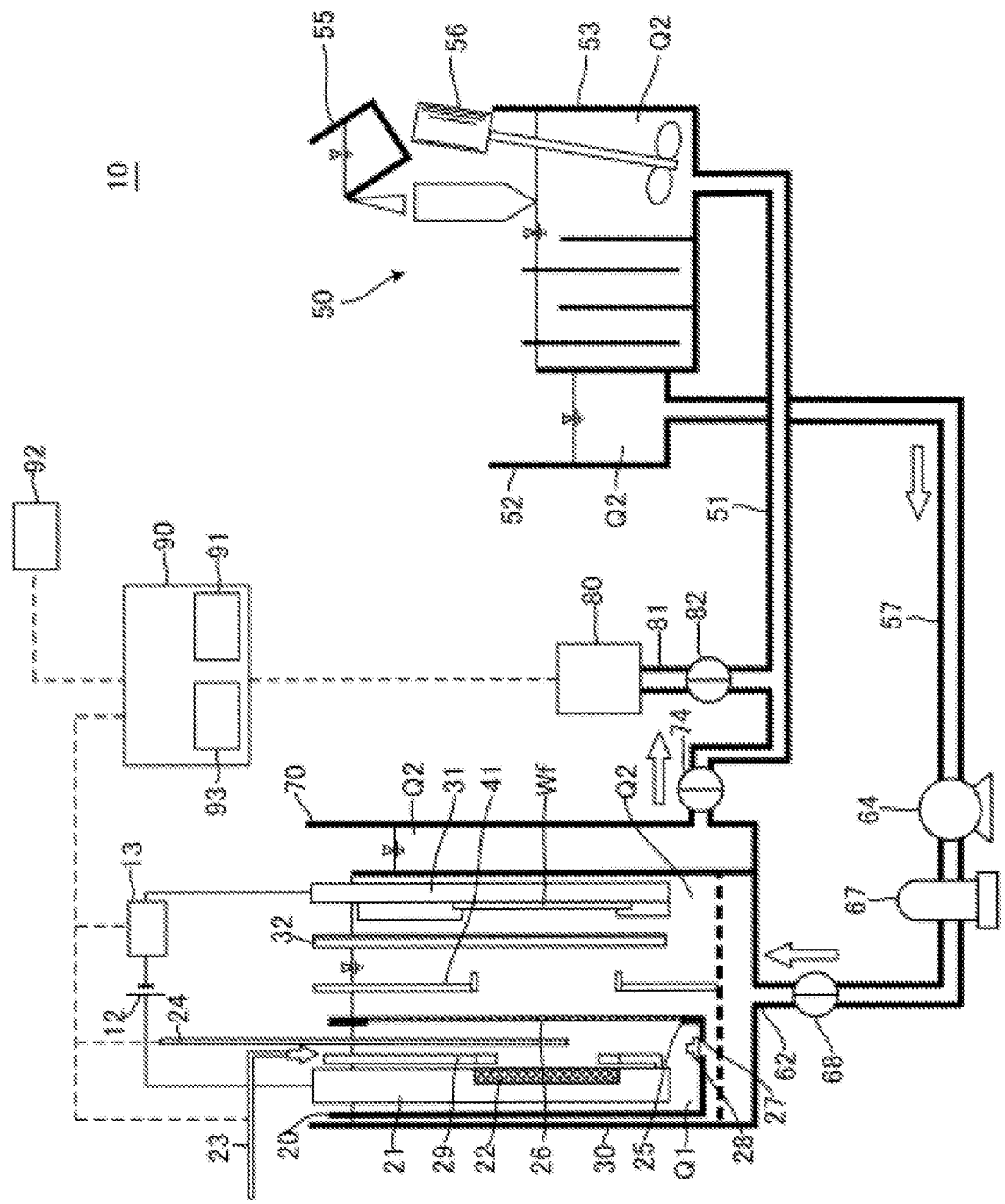
FIG. 1 is a schematic cross-sectional side view of a plating apparatus according to an embodiment.

The following describes embodiments of the present invention with reference to the drawings. In the drawings described later, the identical reference numerals are used for the identical or equivalent components, and therefore such components will not be further elaborated here.

FIG. 1 is a schematic cross-sectional side view of a plating apparatus according to an embodiment of the present invention. As illustrated in the drawing, a plating apparatus 10 according to this embodiment includes an anode bath 20 that holds a plating solution Q1, a cathode bath 30 that holds a plating solution Q2 containing additive, and an overflow bath 70 that houses the plating solution Q2 overflown from the cathode bath 30. As the plating solution Q1 according to this embodiment, solution that contains metal ions (for example, copper ions $Cu^{2+}$ for a copper plating process) target for plating and does not contain additive is used. As the plating solution Q2, solution that contains metal ions target for plating and contains additive (leveler, suppressor, and accelerator) is used. Furthermore, chloride ions can be preliminarily dissolved in the plating solution Q2.

In this embodiment, the anode bath 20, the cathode bath 30, and the overflow bath 70 are disposed in a plating bath. Note that the anode bath and the cathode bath are not limited to have a box shape as illustrated in the drawing. The anode bath may have any shape such as a polygon, and it is only necessary for the anode bath to form a space that can internally house an anode and the plating solution Q1. The anode bath is also referred to as an anode unit. The anode unit means a part that internally houses anolyte and is divided from a peripheral space to ensure immersing the anode in the anolyte (note that the part thus divided from the peripheral area is also referred to as a compartment). Furthermore, the cathode bath is also not limited to have the box shape as illustrated in FIG. 1, for example, may have any shape such as a polygon, and it is only necessary for the cathode bath to at least form a space that can internally hold the plating solution Q2 containing the additive, and a cathode. The cathode bath is also referred to as a cathode unit. The cathode unit means a part that internally houses catholyte and is divided from a peripheral space to ensure immersing the substrate as the cathode in the catholyte.

Further, while the anode unit is included in the cathode unit in FIG. 1, the configuration is not limited to this. For example, the cathode unit may be included in the anode unit, an opening may be provided at a part of a partition wall of the cathode unit, and a diaphragm may be installed at this opening. Alternatively, the anode unit and the cathode unit may be disposed in a positional relationship where the anode unit and the cathode unit are at least partially adjacent to one another, and the diaphragm may be disposed as a partition to divide these units.

The plating apparatus 10 further includes a supply device 50, an analyzer 80, and a control device 90. The supply device 50 collects the plating solution Q2 housed in the overflow bath 70 and supplies the metal ions such as copper ions to the plating solution Q2. The analyzer 80 analyzes constituents of the plating solution Q2. The control device 90 controls respective components of the plating apparatus 10. The analyzer 80 may be configured as an analyzer having a function that, for example, automatically samples the plating solution Q2 at a preliminarily set timing, irradiates the sample with light, and measures the absorbance to quantitatively analyze amounts of the constituents in the plating solution. Alternatively, instead of the analyzer 80, only sampling means having only a function that samples the plating solution Q2 at the preliminarily set timing may be disposed at the plating apparatus 10. In this case, the sampled plating solution can be quantitatively analyzed by another analyzer, quantitative analysis data obtained as the result of the analysis can be transmitted or input to the control device 90.

The anode bath 20 houses an insoluble anode 22 held to an anode holder 21. The cathode bath 30 houses a substrate Wf held to a substrate holder 31. A power supply 12 applies a voltage to the insoluble anode 22 and the substrate Wf. The plating solution Q1 held in the anode bath 20 is separated from the plating solution Q2 held in the cathode bath 30 with a diaphragm 26. The anode bath 20 has an opening 25 (equivalent to one example of an opening for diaphragm) at the side surface. The diaphragm 26 is disposed at the anode bath 20 so as to cover this opening 25. The diaphragm 26 has an area larger than that of the opening 25 and is fixed to the wall surface of the anode bath 20 by thermal welding, with adhesive, or similar method.

The cathode bath 30 internally houses the anode bath 20. The anode bath 20 has a hole 27, which is provided at the bottom portion, and a valve 28 to open and close the hole 27 from the inside of the anode bath 20. When the diaphragm 26 needs to be replaced due to deterioration or similar cause, the anode bath 20 is taken out from the cathode bath 30 and the diaphragm 26 is replaced together with the anode bath 20. That is, the anode bath 20 including the deteriorated diaphragm 26 is taken out, and the anode bath 20 including the new diaphragm 26 is housed in the cathode bath 30.

When the anode bath 20 is taken out from the cathode bath 30, the valve 28 is preliminarily opened. This allows discharging the plating solution Q1 from the hole 27 when the anode bath 20 is taken out from the cathode bath 30. When the anode bath 20 including the new diaphragm 26 is housed in the cathode bath 30, the valve 28 is opened as well. Accordingly, the plating solution Q2 in the cathode bath 30 flows into the anode bath 20 via the hole 27, and thus the inside of the anode bath 20 is filled with the plating solution Q2 (plating solution Q1). Note that a liquid surface level of the plating solution Q2 in the anode bath 20 at this time approximately matches a liquid surface level of the plating solution Q2 in the cathode bath 30. After the inside of the anode bath 20 is filled with the plating solution Q2, the hole 27 is closed. The plating solution Q2 is thus flown from the hole 27 on the bottom portion of the anode bath 20. This eliminates the need for disposing a supply line to supply the plating solution to the anode bath 20. The hole 27 is not limited to be provided on the bottom portion of the anode bath 20 but can be disposed on the wall surface constituting the anode bath 20.

As the plating solution Q2 held in the cathode bath 30, for copper plating in the plating apparatus 10, for example, solution formed of electrolyte produced by mixing sulfuric acid and chlorine with copper sulfate aqueous solution and adding the additive to the mixture is used. The plating solution Q1 held in the anode bath 20 is formed of the electrolyte and is identical to the plating solution Q2 immediately after the anode bath 20 is housed in the cathode bath 30. However, the additive in the plating solution Q1 in the anode bath 20 is consumed in accordance with the progress of the plating process and the elapse of time. The trace amount of the additive in the plating solution Q2 is possibly transmitted into the plating solution Q1 through the diaphragm 26. Meanwhile, the additive is not actively added to the plating solution Q1.

The insoluble anode 22 is made of, for example, platinum coated with iridium oxide, titanium coated with iridium oxide and platinum, titanium coated with iridium oxide, titanium coated with platinum, titanium, or platinum.

The diaphragm 26 is a diaphragm that causes cations to transmit, such as a neutral diaphragm or a cation membrane. The diaphragm 26 may be configured by stacking a plurality of neutral diaphragms, cation membranes, or the like. The diaphragm 26 can reduce the passing of oxygen and the additive. Accordingly, hydrogen ions in the plating solution Q1 in the anode bath 20 can be transmitted through the diaphragm 26 and move to the plating solution Q2 in the cathode bath 30. This reacts the copper sulfate contained in the plating solution Q2 with the hydrogen ions, thus generating divalent copper ions. Meanwhile, the diaphragm 26 reduces the movement of the additive contained in the plating solution Q2 in the cathode bath 30 into the anode bath 20.

The anode holder 21 includes an anode mask 29 configured so as to cover a part of the front surface of the insoluble anode 22. The anode mask 29 can control an electric field on the surface of the insoluble anode 22.

The plating apparatus 10 includes a regulation plate 41 between the diaphragm 26 and the substrate Wf. The regulation plate 41 is a plate-shaped member that has an opening at the center. A voltage (electric field) applied from the insoluble anode 22 to a plated surface of the substrate Wf is controlled according to the shape of the opening on the regulation plate 41. Accordingly, the regulation plate 41 can control a distribution of a metal film thickness deposited on the plated surface of the substrate Wf.

The plating apparatus 10 includes a rod-shaped puddle 32 that stirs the plating solution Q2. The puddle 32 is located between the regulation plate 41 and the substrate Wf and is configured to horizontally swing between the regulation plate 41 and the substrate Wf along the surface of the substrate Wf. By stirring the plating solution Q2 with the puddle 32, the flow rate of the plating solution Q2 on the substrate Wf surface can be improved. This uniformly disperses the copper ions and the additive in the plating solution Q2 on the substrate Wf surface, ensuring further uniforming the thickness of the plating film.

The control device 90 includes a memory 91 that can store predetermined information and an arithmetic processing unit 93 configured to perform a predetermined operation. The control device 90 can communicate with a measuring device 13, a liquid surface level sensor 24, the analyzer 80, and an alarm device 92 described later and is configured to control the respective devices. The memory 91 and the arithmetic processing unit 93 of this embodiment each include a recording medium. The operating state of the plating apparatus 10 is controllable in accordance with various kinds of data and a program recorded in these recording media. Here, the recording media can store programs such as plating process programs and various kinds of setting data. As the recording media, the known recording medium, for example, a computer-readable memory such as a ROM and a RAM, a hard disk, a floppy disk, a CD-ROM, a DVD-ROM, a magneto-optical disk, or a memory card is usable.

The plating apparatus 10 has the liquid surface level sensor 24 to sense the liquid surface level (liquid surface height) of the plating solution Q1. The liquid surface level sensor 24 is configured to transmit information on the sensed liquid surface level to the control device 90. A plating solution supply device 23 may be optionally disposed to supply the anode bath 20 with the plating solution. With the plating solution supply device 23, the control device 90 can control the plating solution supply device 23 to supply the anode bath 20 with the plating solution based on the information on the liquid surface level received from the liquid surface level sensor 24.

The supply device 50 includes a metal ion supply bath 53 that holds the plating solution Q2 and supplies the plating solution Q2 with the metal ions and a supply bath 52 that houses the plating solution Q2 supplied to the cathode bath 30. The metal ion supply bath 53 communicates with the overflow bath 70 via a collecting pipe 51. The supply bath 52 holds the plating solution Q2 overflown from the metal ion supply bath 53 and communicates with a supply port 62, which is disposed on the bottom portion of the cathode bath 30, via a supply pipe 57.

The collecting pipe 51 has a valve 74 to open and close a pipe passage of the collecting pipe 51. The supply pipe 57 includes a pump 64, a filter 67, and a valve 68. The pump 64 is configured to deliver the plating solution Q2 in the supply bath 52. The filter 67 is configured to filter the plating solution Q2 in the supply pipe 57. The valve 68 is configured to open and close a pipe passage of the supply pipe 57.

The supply device 50 includes a metal ion supply source 55 to supply the plating solution Q2 in the metal ion supply bath 53 with the metal ions. The metal ion supply source 55 is formed of copper oxide for the copper plating in the plating apparatus 10. When the metal ion supply source 55 supplies the plating solution Q2 with the copper oxide, this copper oxide reacts with the sulfuric acid contained in the plating solution Q2 and is dissolved in the plating solution Q2, thus increasing the concentration of the copper ion in the plating solution Q2. The supply device 50 includes a stirring device 56 to stir the plating solution Q2. Stirring the plating solution Q2 by the stirring device 56 promotes the dissolution of the copper sulfate in the plating solution Q2.

By opening the valve 74 of the collecting pipe 51, the plating solution Q2 in the overflow bath 70 moves to the metal ion supply bath 53 via the collecting pipe 51 by a difference in position energy. The metal ion supply source 55 and the stirring device 56 increase the concentration of the metal ions in the plating solution Q2 in the metal ion supply bath 53.

The plating solution Q2 with the increased concentration of the metal ion overflows from the metal ion supply bath 53 to the supply bath 52. Driving the pump 64 with the valve 68 of the supply pipe 57 opened delivers the plating solution Q2 in the supply bath 52 from the supply port 62 into the cathode bath 30. Thus, the supply device 50 supplies the plating solution Q2 with the metal ions.

A branch pipe 81 is disposed at the collecting pipe 51 on the downstream side with respect to the valve 74. The branch pipe 81 is provided with a valve 82 to open and close a pipe passage of the branch pipe 81, and one end of the branch pipe 81 is connected to the analyzer 80. By opening the valve 82 of the branch pipe 81, a part of the plating solution Q2 in the collecting pipe 51 flows in the branch pipe 81 and is supplied to the analyzer 80. The analyzer 80 analyzes the concentration of the additive in the plating solution Q2 at, for example, every predetermined time interval. The concentration of the additive analyzed by the analyzer 80 is transmitted to the control device 90. The additive is appropriately added to the plating solution Q2 based on the analyzed concentration of the additive to avoid the concentration of the additive to fall below a predetermined value. The analyzer 80 is not limited to be disposed at the position illustrated in FIG. 1 and can be disposed at an appropriate position where a part of the plating solution Q2 in the cathode bath 30 can be collected.

The plating apparatus 10 includes the measuring device 13 that measures a voltage value applied between the insoluble anode 22 and the substrate Wf and its current value during plating on the substrate Wf. The measuring device 13 includes, for example, an ammeter and a voltmeter. The measuring device 13 is configured to transmit the measured current value and voltage value to the control device 90.

The plating apparatus 10 includes the alarm device 92 that notifies an operator of a determination that a timing to replace the diaphragm 26 has come. Specifically, as the alarm device 92, for example, a sound device such as a speaker, a light-emitting device such as a lamp, or a vibration generating device having a vibration function is employed. The alarm device 92 is communicatively connected to the control device 90 to be controlled by the control device 90.

In the plating apparatus 10 having the above-described configuration, the deterioration of the diaphragm 26 progresses in accordance with the progress of the plating process. During an arrangement work, a replacement work, or similar work of the regulation plate 41, the regulation plate 41 possibly contacts the diaphragm 26 and physically damages the diaphragm 26. In such case, the additive contained in the plating solution Q2 is likely to move into the anode bath 20, thus promoting the decomposition of the additive. To reduce the decomposition of the additive, it is necessary to replace the diaphragm 26 at the appropriate timing when the diaphragm 26 is deteriorated or damaged.

Therefore, the plating apparatus 10 according to this embodiment determines the replacement timing of the diaphragm 26 based on at least one of (1) the concentration of the additive in the plating solution Q2, (2) the liquid surface level of the plating solution Q1 in the anode bath 20, and (3) a ratio of the voltage value to a current density value during plating. The following describes the details.

<<Determination Based on Concentration of Additive in Plating Solution Q2>>

The additive in the plating solution Q2 is consumed according to an electrolytic volume (A•h: at ampere) in the plating apparatus 10. That is, for example, the additive is consumed as the plating on the substrate Wf progresses in the plating apparatus 10. This electrolytic volume is a product of the current value applied in a predetermined period during which the plating process is performed and the predetermined period during which the plating process is performed. Since the additive in the plating solution Q2 is decomposed through the contact with oxygen in air, the additive is also consumed as the time elapses. That is, even while the plating is not performed, the additive consumes according to the length of the period during which the plating solution Q2 contacts the air. Accordingly, defining a consumption of additive as the electrolytic volume as E (A·h), and the length of the period during which the plating solution Q2 contacts the air, namely, the length of the predetermined period as T (h), the formula is expressed as follows.

$$\eta = aE + bT + c$$

Here, a, b, and c are constants. Note that this formula is changed whenever an initial make-up of electrolytic bath is performed with a different kind of plating solution.

This embodiment preliminarily calculates an expected consumption of the additive (expected consumption) during the predetermined period taking the consumption (aE) of the additive caused by the electrolytic volume during the predetermined period and the consumption (bT) of the additive due to the length of the predetermined period (time passage) into consideration based on the above-described formula. That is, the expected consumption is determined according to a parameter regarding the electrolytic volume during the predetermined period and a parameter regarding the length of the predetermined period. The memory 91 in the control device 90 stores this expected consumption. Note that the constant b of the above-described formula possibly changes according to a circulation velocity of the plating solution Q2. Specifically, the constant b possibly changes depending on the flow rate of the plating solution Q2 overflown to the overflow bath 70 in the plating process.

Figure 2:
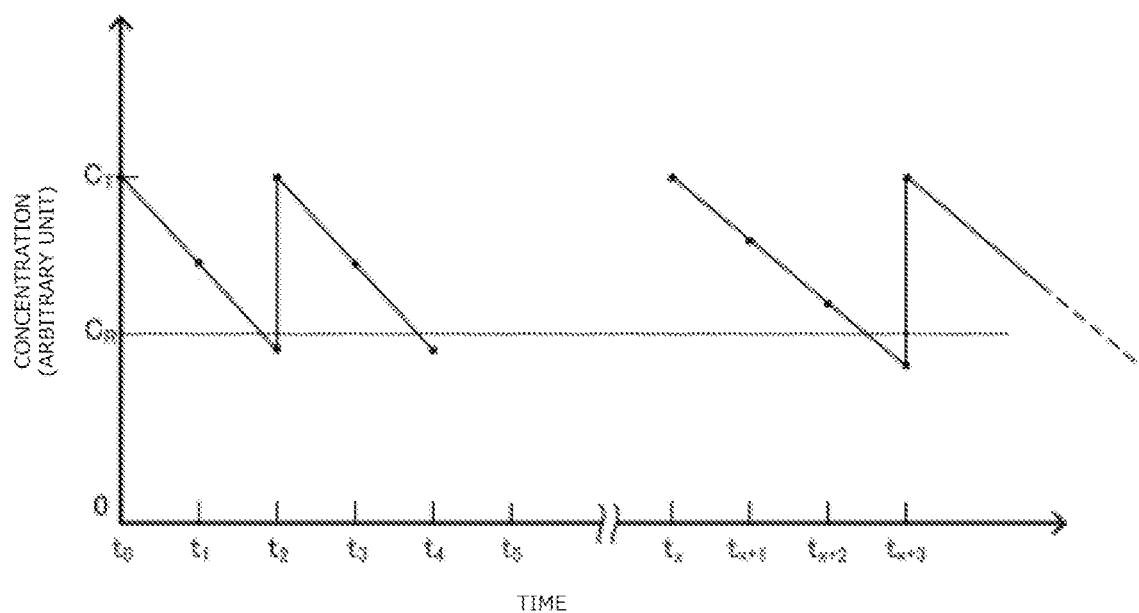
FIG. 2 is a graph illustrating an example of a concentration change of an additive in plating solution.

FIG. 2 is a graph illustrating an example of the concentration change of the additive in the plating solution. In the graph of FIG. 2, the vertical axis indicates the concentration of the additive (arbitrary unit) and the horizontal axis indicates the time. As illustrated in FIG. 2, the concentration of the additive is set to a value close to a predetermined control target value ($C_T$) immediately after the initial make-up of electrolytic bath with the plating solution ($t_0$). As the time elapses, the concentration of the additive gradually lowers ($t_1$, $t_2$). Here, when the concentration of the additive falls below a predetermined control lower limit value ($C_R$) ($t_2$), the additive is added such that the concentration of the additive approaches the control target value ($C_T$). Afterwards, as the time elapses, the concentration of the additive gradually lowers again ($t_3$, $t_4$). In this graph, for example, a value found by multiplying the concentration of the additive decreased from the time $t_0$ to the time $t_1$ by the volume of the plating solution is equivalent to the amount of additive consumed from the time $t_0$ to the time $t_1$. Thus measuring the actual consumption of the additive during the predetermined period multiple times allows obtaining the constants a, b, and c of the above-described formula $\eta = aE + bT + c$. Preliminarily obtaining the constants a, b, and c and assigning the electrolytic volume (E) and the length of the predetermined period (T) for the above-described formula allow obtaining the expected consumption ($\eta$) of the additive.

As illustrated in FIG. 2, when the initial make-up of electrolytic bath is newly performed with the plating solution ($t_x$), the concentration of the additive is again set to the value close to the predetermined control target value ($C_T$). When the initial make-up of electrolytic bath is performed with a new kind of plating solution, the constants a, b, and c in the above-described formula ($\eta = aE + bT + c$) possibly change. Accordingly, to obtain these constants, the actual consumption of the additive during the predetermined period needs to be measured again multiple times.

The expected consumption ($\eta$) of the additive is determined so as to indicate the expected amount of consumed additive in the normal state of the diaphragm 26. This is because that the constants a, b, and c of the above-described formula ($\eta = aE + bT + c$) are the values obtained in the normal state of the diaphragm 26. In contrast to this, in the case where the diaphragm 26 is deteriorated, the diaphragm 26 is physically damaged, or similar case, since the additive in the plating solution Q2 is likely to move to the anode bath 20, compared with the case of the normal diaphragm 26, the amount of additive consumed during the predetermined period increases. Specifically, the value of the constant c of the above-described formula increases.

In this embodiment, the analyzer 80 analyzes the concentration of the additive in the plating solution Q2 in the cathode bath 30 at every predetermined time interval (for example, once a day). The control device 90 calculates the actual consumption of the additive during the predetermined period (actual consumption) based on the concentration of the additive analyzed at every predetermined time interval. Specifically, the actual consumption is calculated from the concentration change of the additive during the predetermined period.

As long as the diaphragm 26 is normal, this actual consumption approximately matches the expected consumption ($\eta$). However, when the diaphragm 26 is abnormal, the actual consumption becomes larger than the expected consumption ($\eta$). Therefore, the control device 90 compares the actual consumption with the expected consumption by the arithmetic processing unit 93 and determines whether a difference between the actual consumption and the expected consumption is equal to or more than a predetermined value or not. When the control device 90 determines that the difference between the actual consumption and the expected consumption is equal to or more than the predetermined value, the control device 90 determines that the diaphragm 26 is abnormal and controls the alarm device 92 so that the operator is alarmed. The operator knows that the diaphragm 26 comes to the replacement timing by this alarm and can perform the work to replace the diaphragm 26.

Figure 3:
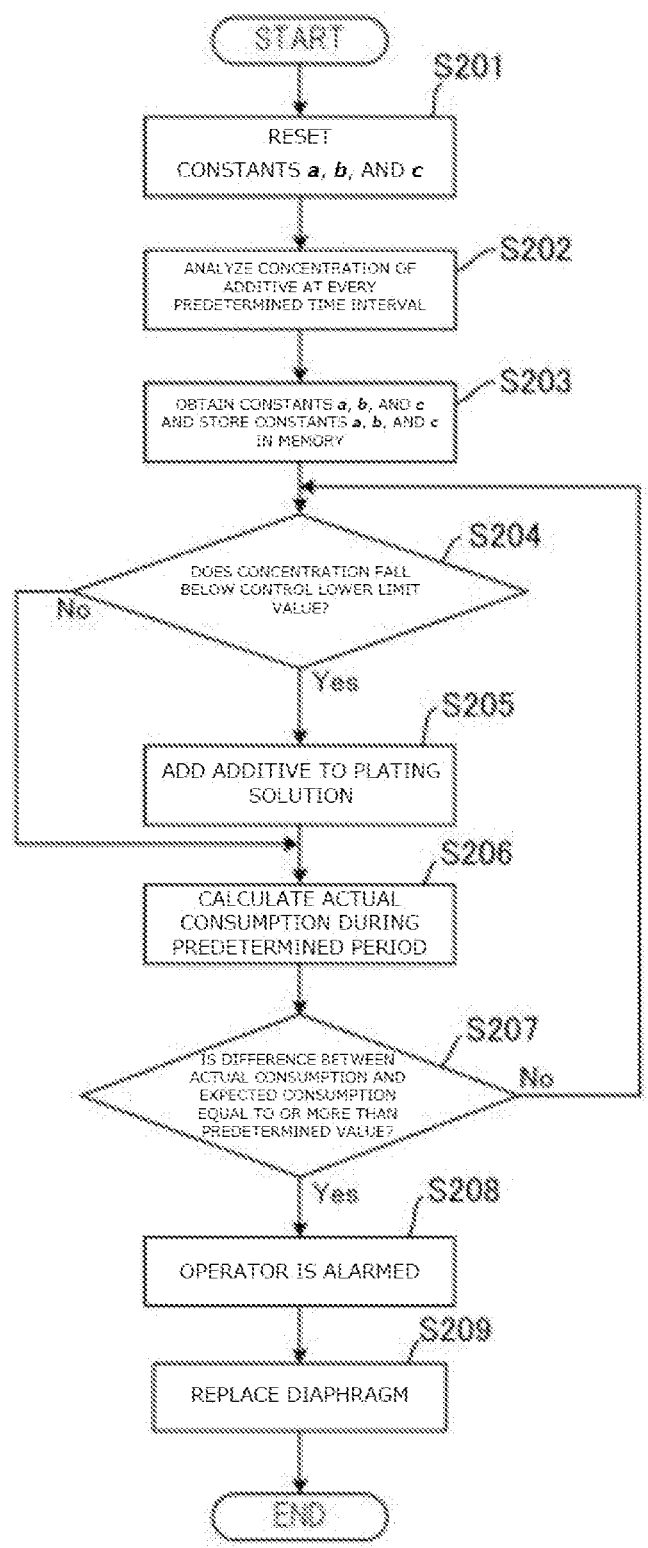
FIG. 3 is a drawing illustrating a flow of a process to replace a diaphragm based on the concentration of the additive in plating solution in an anode bath by a plating method according to this embodiment.

FIG. 3 is a drawing illustrating a flow of a process to replace the diaphragm 26 based on the concentration of the additive in plating solution Q2 by the plating method according to this embodiment. First, when the initial make-up of electrolytic bath is performed with the plating solution, the constants a, b, and c of the above-described formula ($\eta = aE + bT + c$) stored in the memory 91 in the control device 90 are reset (Step S201). Note that when the data of the constants a, b, and c are not stored in the memory 91, this step is omitted. Subsequently, the analyzer 80 analyzes the concentration of the additive in the plating solution Q2 in the cathode bath 30 at every predetermined time interval (Step S202).

At Step S202, the constants a, b, and c are obtained based on the concentration of the additive analyzed at every predetermined time interval and the values are stored in the memory 91. Specifically, the plating process is performed on a plurality of substrates and the concentration of the additive is measured at every predetermined time interval. First, a difference ($\Delta C_1 = |C_1 - C_2|$) between a first measured value ($C_1$) and a second measured value ($C_2$) and an electrolytic volume ($E_1$) and a period ($T_1$) between the first measurement and the second measurement are calculated. Here, a value ($\Delta C_2 \times V$) found by multiplying the difference ($\Delta C_1$) by a volume (V) of the plating solution Q2 becomes an actual consumption ($\eta_1$) of the additive during the predetermined period. Thus, $\eta_1 = aE_1 + bT_1 + c$ is satisfied.

Subsequently, a difference ($\Delta C_2$) between the second measured value ($C_2$) and a third measured value ($C_3$) and an electrolytic volume ($E_2$) and a period ($T_2$) between the second measurement and the third measurement are calculated. Thus, $\eta_2=aE_2+bT_2+c$ is satisfied. Similarly, a difference ($\Delta C_3$) between the third measured value ($C_3$) and a fourth measured value ($C_4$) and an electrolytic volume ($E_3$) and a period ($T_3$) between the third measurement and the fourth measurement are calculated. Thus, $\eta_3=aE_3+bT_3+c$ is satisfied. Thus, at least three formulae, preferably ten or more formulae are calculated to obtain the values of the averaged constants a, b, and c by simultaneous equations and statistical method. The memory 91 stores these values of the constants a, b, and c.

After the memory 91 is caused to store the constants a, b, and c, the plating process is successively performed with the identical plating solution and the measurement of the concentration of the additive at Step S202 is continued. At this time, in the fourth or later measurement or preferably in the eleventh or later measurement, the control device 90 determines whether the concentration of the additive falls below a control lower limit value ($C_R$) (Step S204). When the concentration of the additive falls below the control lower limit value ($C_R$) (Step S204: Yes), the additive is added to the plating solution Q2 such that the concentration of the additive approaches the control target value ($C_T$) (Step S205). Note that this additive may be automatically added by a predetermined apparatus or may be manually added by a worker. Unless the concentration of the additive falls below the control lower limit value ($C_R$) (Step S204: No), the additive is not added.

Subsequently, the arithmetic processing unit 93 in the control device 90 calculates the actual consumption of the additive during the predetermined period based on the analysis result of the additive concentration at every predetermined time interval (Step S206). Specifically, this actual consumption is obtained by multiplying a difference ($\Delta C_x$) between the X-th measured value ($C_x$) and the X+1-th measured value ($C_{x+1}$) by the volume (V) of the plating solution Q2. In the case where the additive has been added to the plating solution Q2 between the X-th measurement and the X+1-th measurement at Step S205, multiplication of a difference between the value of the control target value ($C_T$) and the X+1-th measured value ($C_{x+1}$) by the volume (V) of the plating solution Q2 obtains the actual consumption. Based on this actual consumption, the control device 90 compares the actual consumption with the expected consumption and determines whether this difference is equal to or more than a predetermined value or not (Step S207). The expected consumption ($\eta$) at this time is obtained by assigning the electrolytic volume (E) and the period (T) between the X-th measurement and the X+1-th measurement for the formula of $\eta=aE+bT+c$.

When it is determined that the difference between the actual consumption and the expected consumption is not equal to or more than the predetermined value (Step S207: No), the diaphragm 26 is regarded as not abnormal, the process returns to Step S204, and further the plurality of substrates are successively processed (Steps S204 to S206). When it is determined that the difference between the actual consumption and the expected consumption is equal to or more than the predetermined value (Step S207: Yes), the operator is alarmed that the diaphragm 26 is abnormal by the alarm device 92 (Step S208). The operator knows that the diaphragm 26 is abnormal by the alarm from the alarm device 92 and replaces the diaphragm 26 together with the anode bath 20 (Step S209). When the replacement work of the diaphragm 26 is automated, the diaphragm 26 and the anode bath 20 may be automatically replaced without activating the alarm by the alarm device 92 (Step S208). After the diaphragm 26 is replaced at Step S209, the respective steps can be repeated from Step S201 or Step S202.

As described above, since the control device 90 determines whether the difference between the actual consumption and the expected consumption of the additive is equal to or more than the predetermined value or not in this embodiment, the operator can know that the diaphragm 26 is deteriorated or damaged based on this determination result. Accordingly, the operator can replace the diaphragm 26 at the appropriate timing when the diaphragm 26 is deteriorated or damaged. Since the expected consumption is determined according to the parameter regarding the electrolytic volume during the predetermined period and the parameter regarding the length of the predetermined period, the accurate expected consumption is obtained. In view of this, the presence/absence of deterioration or damage of the diaphragm 26 can be accurately determined. Furthermore, the alarm device 92 can notify the operator that the diaphragm 26 should be replaced; therefore, the replacement timing of the diaphragm 26 is not missed.

<<Determination Based on Liquid Surface Level of Plating Solution Q1 in Anode Bath 20>>

When the plating apparatus 10 terminates the plating on the substrate Wf, the substrate Wf is taken out from the cathode bath 30 together with the substrate holder 31 by a substrate holder conveyance device (not illustrated), and the substrate holder 31 including another substrate Wf is housed in the cathode bath 30. While the substrate Wf is absent in the cathode bath 30, the liquid surface level of the plating solution Q2 in the cathode bath 30 lowers by the amount equivalent to the volumes of the substrate holder 31 and the substrate Wf. This lowers the liquid surface level of the plating solution Q2 than the liquid surface level of the plating solution Q1 in the anode bath 20. The normal diaphragm 26 hardly causes the plating solution Q1 to pass through; therefore, the liquid surface level of the plating solution Q1 in the anode bath 20 is maintained with the normal diaphragm 26. However, when holes through which the plating solution Q1 is passable are formed on the diaphragm 26 due to, for example, the deterioration of the diaphragm 26 and the physical damage of the diaphragm 26, the plating solution Q1 flows in the cathode bath 30 through these holes. Consequently, the liquid surface level of the plating solution Q2 in the anode bath 20 lowers.

The liquid surface level in the anode bath 20 becomes lower than a predetermined level when the diaphragm 26 is abnormal and the substrate Wf is absent in the cathode bath. Since the control device 90 is configured to manage and monitor location information of the substrate Wf to convey the substrate Wf held to the substrate holder 31, the control device 90 can refer to this information and determine whether the substrate Wf is present in the cathode bath 30. Then, in the case where the substrate Wf is absent in the cathode bath 30 and the liquid surface level in the anode bath 20 is lower than the predetermined level, the diaphragm 26 is possibly abnormal.

The substrate holder conveyance device (not illustrated) takes out the substrate Wf and the substrate holder 31 from the cathode bath 30 in response to an instruction from the control device 90. Accordingly, the control device 90 can sense that the substrate Wf and the substrate holder 31 are absent in the cathode bath 30. The liquid surface level sensor 24 senses the liquid surface level of the plating solution Q2 in the cathode bath 30 and transmits the result to the control device 90. In this embodiment, the control device 90 determines whether the liquid surface level of the plating solution Q2 received while the substrate Wf and the substrate holder 31 are absent in the cathode bath 30 is equal to or less than the predetermined level or not. This allows sensing that the plating solution Q1 in the anode bath 20 flows in the cathode bath 30 while the substrate Wf and the substrate holder 31 are absent in the cathode bath 30 due to abnormality of the diaphragm 26. When the control device 90 determines that the liquid surface level of the plating solution Q2 received while the substrate Wf and the substrate holder 31 are absent in the cathode bath 30 is equal to or less than the predetermined level, the control device 90 controls the alarm device 92 such that the operator is alarmed. The operator can know that the diaphragm 26 comes to the replacement timing by this alarm and perform the work to replace the diaphragm 26.

Figure 4:
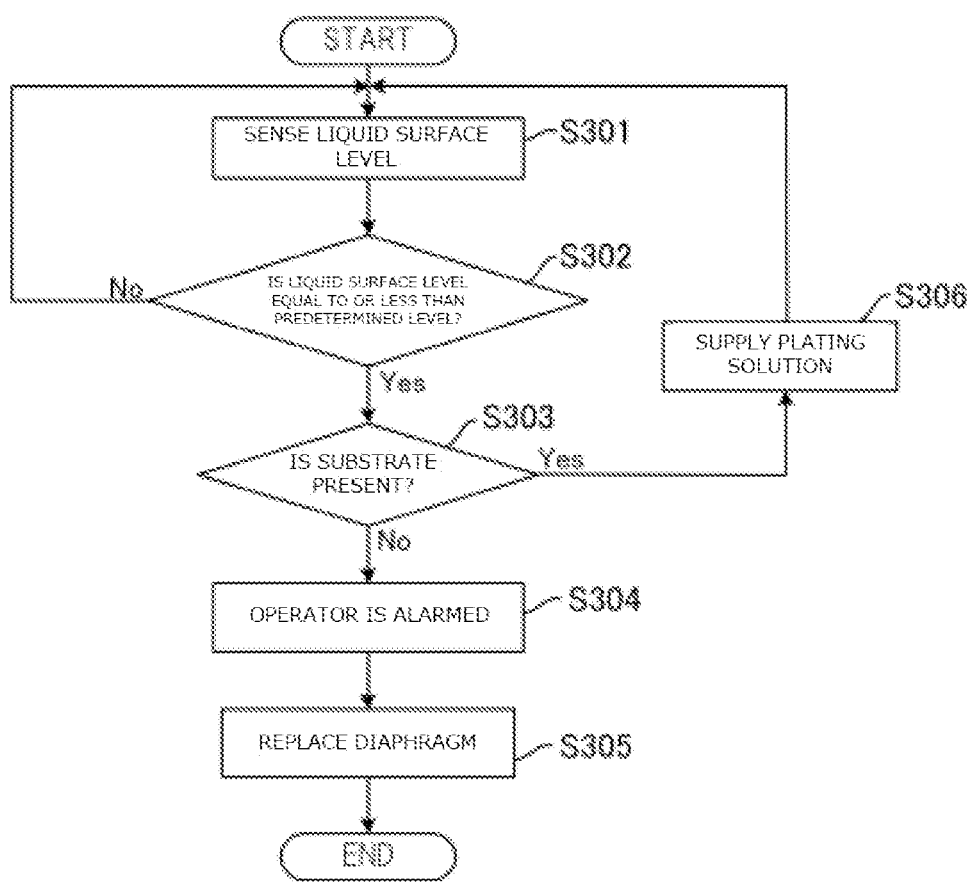
FIG. 4 is a drawing illustrating a flow of a process to replace the diaphragm based on a liquid surface level of the plating solution in the anode bath by the plating method according to this embodiment.

FIG. 4 is a drawing illustrating a flow of a process to replace the diaphragm 26 based on the liquid surface level of the plating solution Q1 in the anode bath 20 by the plating method according to this embodiment. First, the liquid surface level sensor 24 senses the liquid surface level of the plating solution Q1 in the anode bath 20 (Step S301). Subsequently, the control device 90 determines whether the sensed liquid surface level is equal to or less than the predetermined level or not (Step S302).

When the control device 90 determines that the sensed liquid surface level is not equal to or less than the predetermined level (Step S302: No), the liquid surface level sensor 24 again senses the liquid surface level (Step S301). On the other hand, when the control device 90 determines that the sensed liquid surface level is equal to or less than the predetermined level (Step S302: Yes), the control device 90 subsequently determines whether the substrate Wf is present in the cathode bath 30 or not (Step S303).

When the control device 90 determines that the substrate Wf is present in the cathode bath 30 (Step S303: Yes), it is presumed that the liquid surface level of the plating solution Q1 in the anode bath 20 lowered due to vaporization of the plating solution Q1 or similar cause. Accordingly, in this case, the plating solution is supplied to the anode bath 20 as necessary (Step S306).

On the other hand, when the control device 90 determines that the substrate Wf is absent in the cathode bath 30 (Step S303: No), it is presumed that the diaphragm 26 is deteriorated or the diaphragm 26 is physically damaged. Accordingly, in this case, the operator is alarmed at the abnormality by the alarm device 92 (Step S304). The operator knows that the diaphragm 26 is abnormal by the alarm from the alarm device 92 and replaces the diaphragm 26 together with the anode bath 20 (Step S305). When the replacement work of the diaphragm 26 is automated, the diaphragm 26 and the anode bath 20 may be automatically replaced without activating the alarm by the alarm device 92 (Step S304). After the diaphragm 26 is replaced at Step S305, the respective steps can be repeated from Step S301.

As described above, since the control device 90 determines whether the liquid surface level of the plating solution Q2 is equal to or less than the predetermined level or not in this embodiment, the operator can know that the diaphragm 26 is deteriorated or damaged based on this determination result. Accordingly, when the diaphragm 26 is deteriorated or damaged, the operator can immediately replace the diaphragm 26. Furthermore, the alarm device 92 can notify the operator that the diaphragm 26 should be replaced; therefore, the replacement timing of the diaphragm 26 is not missed.

<<Determination Based on Ratio of Voltage Value to Current Density Value During Plating>>

The plating apparatus 10 forms a film on the substrate Wf by flowing the current to the insoluble anode 22 and the substrate Wf. Here, to form the film on the substrate Wf at a predetermined speed, the power supply 12 is controlled such that the predetermined current flows through the insoluble anode 22 and the substrate Wf. Here, one element determining an electrical resistance between the insoluble anode 22 and the substrate Wf is the diaphragm 26. For example, when the additive attaches to the diaphragm 26 and the diaphragm 26 is clogged, the electrical resistance between the insoluble anode 22 and the substrate Wf increases. For example, in the case where the diaphragm 26 is physically damaged and tears or in the case where the deterioration of the diaphragm 26 increases a mesh size of the diaphragm 26, the electrical resistance between the insoluble anode 22 and the substrate Wf decreases. Here, a resist layer having an opening is formed on the surface of the substrate to be plated. Plating the substrates having the openings of different area sizes changes the electrical resistances according to the areas of the openings. In view of this, it is necessary to take the area of this opening, that is, the size of the area (plated area) of the part to be plated into consideration (Note that the plated area is expressed like 6.78 dm$^2$ in the case of, for example, a wafer with 300 mm). Therefore, this embodiment monitors a value of a ratio of the voltage value to a current density value i(=I/S), which is a ratio of a current I to a value of a plated area S during plating, to determine the presence/absence of abnormality in the diaphragm 26.

Specifically, the measuring device 13 in the plating apparatus 10 measures the voltage value applied between the insoluble anode 22 and the substrate Wf and the current value flowing between the insoluble anode 22 and the substrate Wf during plating of the substrate Wf. The measuring device 13 transmits the measured voltage value and current value to the control device 90. The control device 90 calculates a difference between a ratio of the voltage value to the current density value (voltage value/current density value) and a reference value based on the received voltage value and current value and an aperture ratio of the substrate Wf. Here, the reference value means the ratio of the voltage value between the insoluble anode 22 and the substrate Wf to the current density value (voltage value/current density value) while the diaphragm 26 is not abnormal. The memory 91 in the control device 90 can store this reference value.

The control device 90 determines whether the above-described difference is equal to or more than a predetermined value or not. The above-described difference being equal to or more than the predetermined value means that the diaphragm 26, for example, is clogged, tears, or is deteriorated. Accordingly, when determining that the above-described difference is equal to or more than the predetermined value, the control device 90 controls the alarm device 92 such that the operator is alarmed. The operator can know that the diaphragm 26 comes to the replacement timing by this alarm and perform the work to replace the diaphragm 26.

The control device 90 can cause the memory 91 to store the ratio of the voltage value to the current density value based on the current value measured by the measuring device 13 immediately after the replacement of the diaphragm 26 as the reference value. The reason is that the diaphragm 26 immediately after the replacement is considerably less likely to cause the clogging, the tear, the deterioration, or similar abnormality in the diaphragm 26.

The plating apparatus 10 can form films on various kinds of the substrates Wf. To appropriately form the films on various kinds of the substrates Wf, the plating apparatus 10 forms the films in accordance with process recipes suitable for the respective substrates Wf. That is, the plating apparatus 10 applies the voltages and the currents suitable for the respective substrates Wf to the substrates Wf. Accordingly, the voltage value applied to the substrate Wf and its current density value change depending on the process recipe. In view of this, even when only any one of the voltage value applied to the substrate Wf and the current density value is monitored, it is difficult to determine whether the abnormality in the diaphragm 26 changes the voltage value or the current density value or the change in the process recipe changes the voltage value or the current density value. In contrast to this, the ratio of the voltage value to the current density value does not largely change depending on the change in the process recipe and mainly depends on the electrical resistance between the insoluble anode 22 and the substrate Wf. Since this embodiment determines the abnormality of the diaphragm 26 based on the ratio of the voltage value to the current density value, even when various kinds of the substrates Wf are plated, the abnormality of the diaphragm 26 can be appropriately determined.

Figure 5:
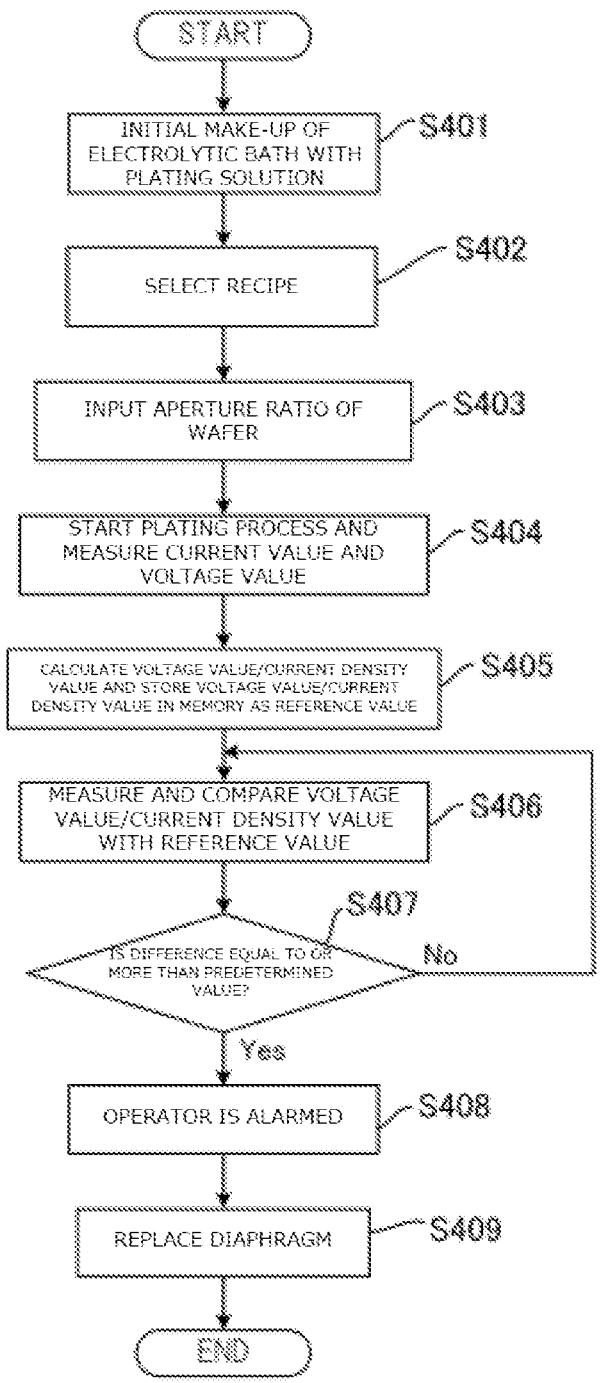
FIG. 5 is a drawing illustrating a flow of a process to replace the diaphragm based on a ratio of a voltage value to a current value during plating by the plating method according to this embodiment.

FIG. 5 is a drawing illustrating a flow of a process to replace the diaphragm 26 based on the ratio of the voltage value to the current density value during plating in the plating method according to this embodiment. First, before starting the plating process, the initial make-up of electrolytic bath is performed with the plating solution (Step S401), the process recipe is selected (Step S402), and the aperture ratio of the substrate Wf such as a wafer is input (Step S403). Here, the aperture ratio of the substrate Wf means a proportion of an area of a part not covered with a resist (the opening of the resist) in an area of a region edged with the resist outer edge. The process recipe contains information on the area of the region edged with the resist outer edge in the substrate Wf. By inputting the aperture ratio of the substrate Wf, the control device 90 automatically calculates the area of the opening of the resist.

The plating process is started afterwards, and the measuring device 13 measures the voltage value applied between the insoluble anode 22 and the substrate Wf and the current value flowing between the insoluble anode 22 and the substrate Wf multiple times (preferably 10 times or more) at predetermined timings (Step S404). Subsequently, the plurality of voltage values and current values measured here are averaged while the variations are statistically considered, and the current density value is calculated based on the averaged current value and the area of the opening of the substrate Wf. The memory 91 stores the ratio of the averaged voltage value to this current density value (voltage value/current density value) as the reference value (Step S405).

The plating process is continued after the storage of the above-described reference value in the memory 91. The measuring device 13 measures the voltage value and the current value in this plating process. The control device 90 compares the ratio of the measured voltage value to the current density value obtained from the measured current value (voltage value/current density value) with the reference value (Step S406). The control device 90 determines whether a difference between the ratio of the measured voltage value to the current density value and the reference value is equal to or more than the predetermined value or not (Step S407). When the above-described difference is determined as not equal to or more than the predetermined value (Step S407: No), it is presumed that the diaphragm 26, for example, is not clogged, is not torn, or is not deteriorated. Accordingly, in this case, the plating process and the measurements of the voltage value and the current density value are continued (Step S406).

Meanwhile, when the control device 90 determines that the above-described calculated difference is equal to or more than the predetermined value (Step S407: Yes), it is presumed that the diaphragm 26, for example, is clogged, is torn, or is deteriorated. Accordingly, in this case, the operator is alarmed at the abnormality by the alarm device 92 (Step S408). The operator knows that the diaphragm 26 is abnormal from the alarm by the alarm device 92 and replaces the diaphragm 26 together with the anode bath 20 (Step S409). In the case where the replacement work of the diaphragm 26 is automated, the alarm device 92 does not need to activate the alarm (Step S408) and the diaphragm 26 and the anode bath 20 may be automatically replaced. After the diaphragm 26 is replaced at Step S408, the respective steps can be repeated from Step S401.

As described above, since the control device 90 determines whether the difference between the ratio of the voltage value to the current density value and the reference value is equal to or more than the predetermined value or not in this embodiment, the operator can know that the diaphragm 26 is deteriorated or damaged based on this determination result. Accordingly, when the diaphragm 26 is deteriorated or damaged, the operator can immediately replace the diaphragm 26. Additionally, since the reference value is the ratio of the voltage value to the current density value while the diaphragm 26 is not abnormal, the control device 90 can accurately determine the presence/absence of abnormality in the diaphragm 26 through the comparison of the ratio of the voltage value to the current value with the reference value. Furthermore, the alarm device 92 can notify the operator that the diaphragm 26 should be replaced; therefore, the replacement timing of the diaphragm 26 is not actually missed.

Figure 6:
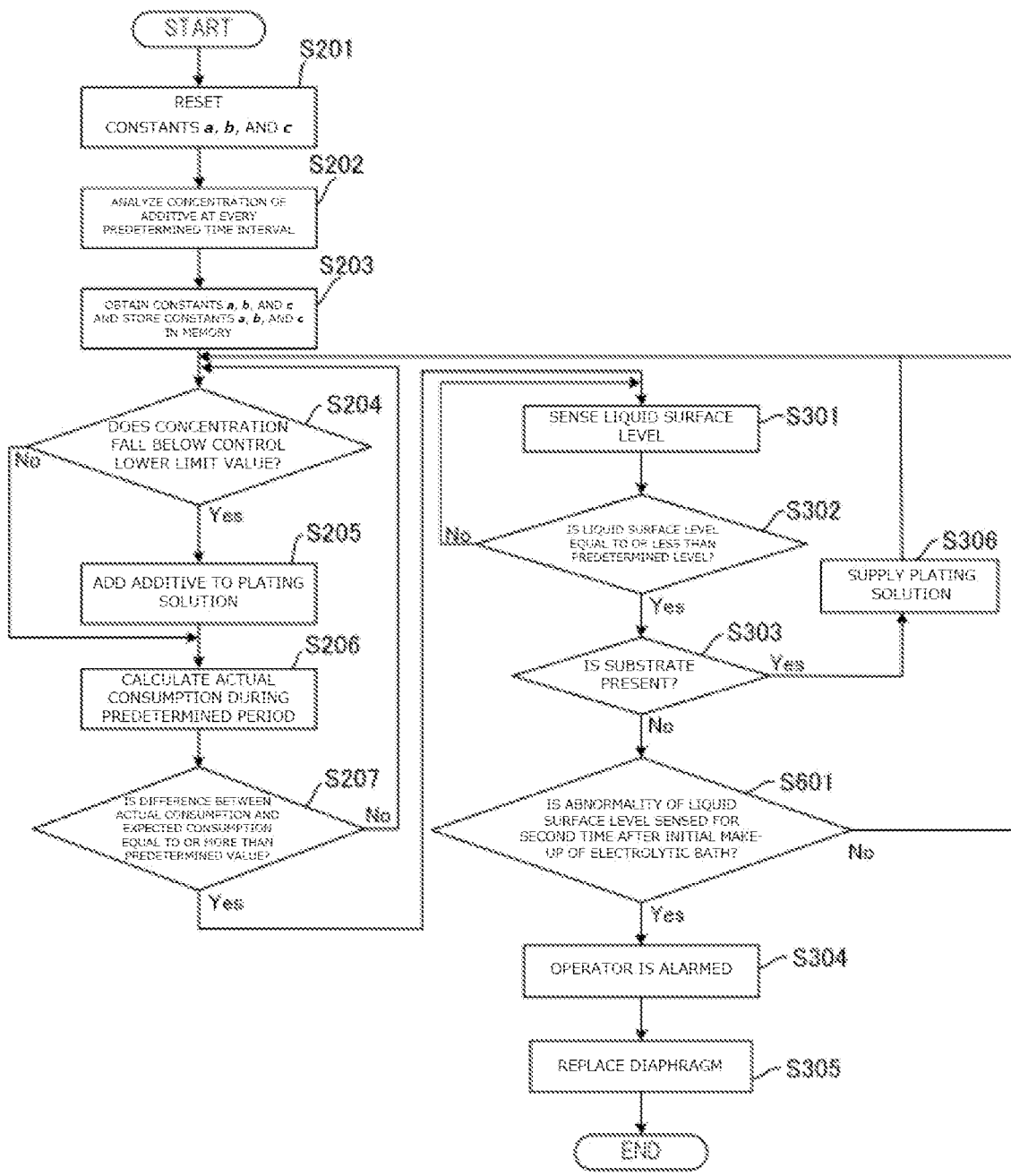
FIG. 6 is a drawing illustrating a flow of a process to replace the diaphragm based on the concentration of the additive in the plating solution and the liquid surface level of the plating solution in the anode bath.

Subsequently, the following describes a process of determining the replacement timing of the diaphragm 26 by any combination of the processes illustrated in FIG. 3 to FIG. 5. FIG. 6 is a drawing illustrating a flow of a process to replace the diaphragm 26 based on the concentration of the additive in the plating solution Q2 and the liquid surface level of the plating solution Q1 in the anode bath 20.

As illustrated in FIG. 6, in this process flow, Step S201 to Step S207 described in FIG. 3 are performed. At Step S207, when it is determined that the difference between the actual consumption and the expected consumption is equal to or more than the predetermined value (Step S207: Yes), the diaphragm 26 is regarded as possibly abnormal and subsequently the liquid surface level is confirmed.

Subsequently, Step S301 to Step S306 described in FIG. 4 and Step S601 are performed. When it is determined that the substrate Wf is absent in the cathode bath 30 at Step S303 (Step S303: No), whether the abnormality of the liquid surface level has been sensed for the second time or not is confirmed (Step S601). When the abnormality has been sensed for the second time (Step S601: Yes), the operator is alarmed at the abnormality by the alarm device 92 (Step S304). When the substrate is determined as present at Step S303 (Step S303: Yes) and the plating solution is supplied to the anode bath 20 (Step S306), or when the abnormality of the liquid surface level has been sensed for the first time (Step S601: No), the process returns to the step of confirming the abnormality in the membrane based on the concentration of the additive in the plating solution Q2, which is at and after Step S204, and the state of the membrane is confirmed again while the plating process is continued.

When an alarm is activated (Step S304), the operator determines that the diaphragm 26 is abnormal from the alarm by the alarm device 92 and replaces the diaphragm 26 together with the anode bath 20 (Step S305).

Thus performing the process of FIG. 4 in addition to the process of FIG. 3 and then determining the replacement timing of the diaphragm 26 allow further accurately determining whether the diaphragm 26 comes to the replacement timing or not. In the process illustrated in FIG. 6, the liquid surface level is regularly confirmed. On the other hand, as described above, the additive concentration is confirmed, for example, once a day. There is a case where the frequency of inspection of the diaphragm 26 may be around once a day. In this case, the additive concentration is confirmed at the frequency of once a day. At the stage where the diaphragm 26 is regarded as possibly abnormal through this confirmation, this confirmation result is promptly collated with the confirmation result of the liquid surface level, thus ensuring determining the presence/absence of abnormality in the diaphragm 26.

Conventionally, when the plating solution in the plating apparatus came to the end of life and the initial make-up of electrolytic bath was performed again with the plating solution, the wear state of the diaphragm 26 immersed in the plating bath was able to be confirmed. Conventionally, for evaluation of the state of the diaphragm 26 during the plating process, it was necessary to take out the diaphragm 26 outside the plating apparatus. To uniformly form the plating film on the substrate Wf in the plating apparatus, it is preferred that the positions of the substrate Wf, the anode, and the regulation plate 41 are on an identical straight line and the substrate Wf, the anode, and the regulation plate 41 are parallel to one another. Here, when the diaphragm 26 is attempted to be taken out outside the plating apparatus in the middle of the successive plating processes on the substrate Wf, the positional relationship between the substrate Wf, the anode, and the regulation plate 41 is displaced each time, and therefore the relative positions of the respective components need to be adjusted (so-called alignment) again. This adjustment takes a labor and a comparatively long time. Taking out the diaphragm 26 outside the apparatus only for confirmation of the state of the diaphragm 26 and directly confirming the diaphragm 26 are not preferred from an aspect of securing the operating period of the plating apparatus as long as possible. In view of this, conventionally, evaluating the state of the diaphragm 26 in the middle of the successive plating processes for evaluation of the wear level of the diaphragm 26 was difficult when a throughput of the plating apparatus was taken into consideration.

Meanwhile, this embodiment allows an In-situ evaluation at the appropriate timing even when the state of the diaphragm 26 is difficult to be determined by only a so-called visual check, such as a change in a surface chemical species of the diaphragm 26 installed in the plating apparatus resulting in failing to provide the function and an enlarged pore size of the diaphragm resulting in deterioration of separation performance of the membrane.

Figure 7:
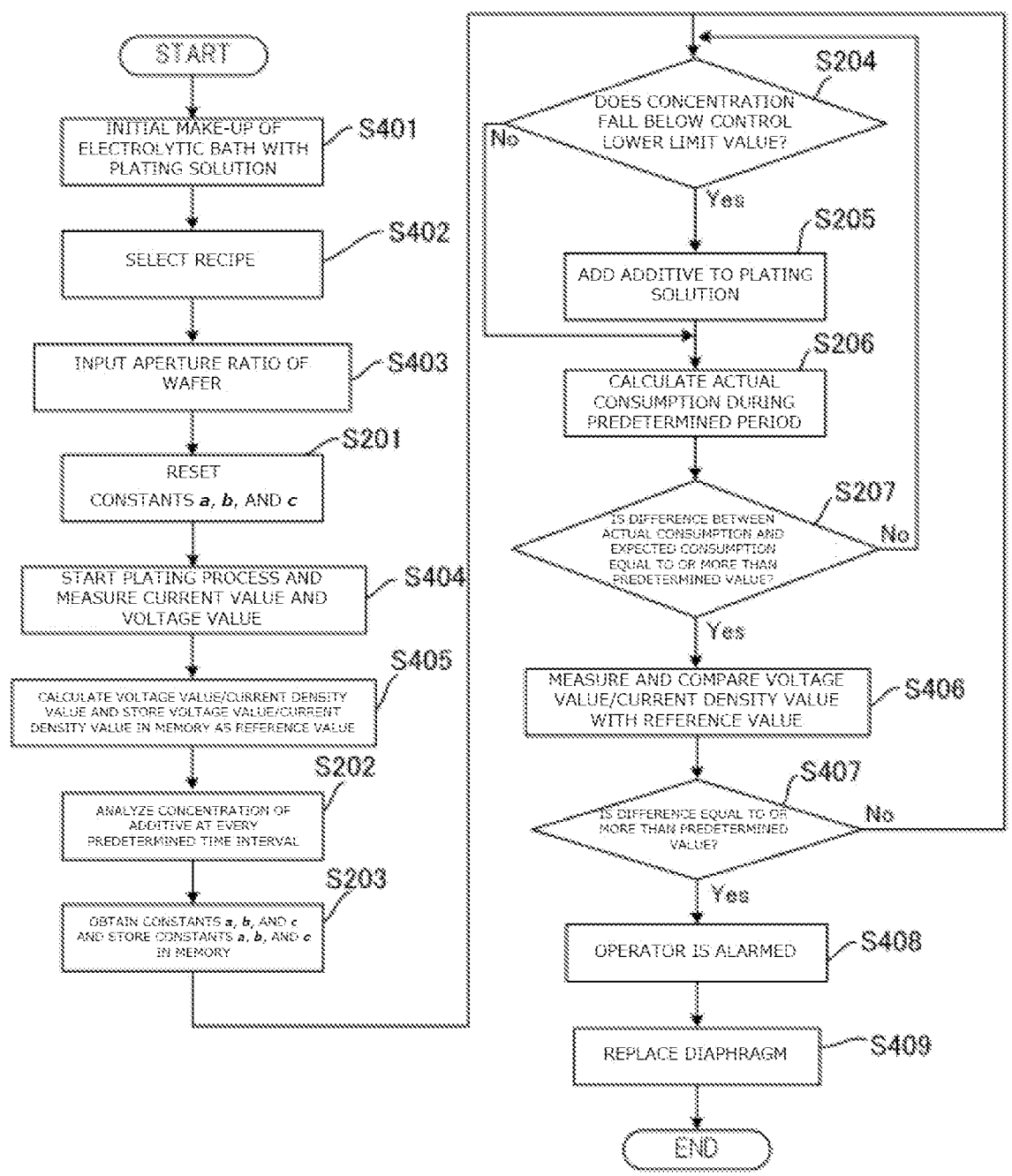
FIG. 7 is a drawing illustrating a flow of a process to replace the diaphragm based on the concentration of the additive in the plating solution and a ratio of the voltage value to a current density value during plating.

FIG. 7 is a drawing illustrating a flow of a process to replace the diaphragm 26 based on the concentration of the additive in the plating solution Q2 and the ratio of the voltage value to the current density value during plating. As illustrated in FIG. 7, in this process flow, Step S401 to Step S403 illustrated in FIG. 5 and Step S201 described in FIG. 3 are performed first before the plating process. Subsequently, Step S404 and Step S405 described in FIG. 5 and Step S202 and Step S203 described in FIG. 3 are performed.

At this time, Step S202 and Step S203 may be performed simultaneously with or before Step S404 and Step S405.

Subsequently, Step S204 to Step S207 described in FIG. 3 are performed. At Step S207, when it is determined that the difference between the actual consumption and the expected consumption is equal to or more than the predetermined value (Step S207: Yes), the diaphragm 26 is regarded as possibly abnormal and the membrane state is confirmed based on the ratio of the voltage value to the current density value during plating at the next step.

Subsequently, Step S406 to Step S409 described in FIG. 5 are performed. When the above-described calculated difference is determined as equal to or more than the predetermined value at Step S407 (Step S407: Yes), the operator is alarmed at the determination by the alarm device 92 (Step S408). The operator determines that the diaphragm 26 is abnormal from the alarm by the alarm device 92 and replaces the diaphragm 26 together with the anode bath 20 (Step S409). When the above-described calculated difference is determined as less than the predetermined value at Step S407 (Step S407: No), the process again returns to Step S204 and the monitoring of the membrane state based on the difference between the actual consumption and the expected consumption is continued while the plating process is continued.

Thus performing the process of FIG. 5 in addition to the process of FIG. 3 and then determining the replacement timing of the diaphragm 26 allow further accurately determining whether the diaphragm 26 comes to the replacement timing or not. In the process illustrated in FIG. 7, the current density and the voltage are regularly monitored. On the other hand, as described above, the additive concentration is confirmed, for example, once a day. There is a case where the frequency of inspection of the diaphragm 26 may be around once a day. In this case, the additive concentration is confirmed at the frequency of once a day. At the stage where the diaphragm 26 is regarded as possibly abnormal through this confirmation, this confirmation result is promptly collated with the confirmation result of the ratio of the voltage value to the current density value, thus ensuring determining the presence/absence of abnormality in the diaphragm 26. Thus, this embodiment allows an In-situ evaluation at the appropriate timing even when the state of the diaphragm 26 is difficult to be determined by only a so-called visual check, such as a change in a surface chemical species of the diaphragm 26 installed in the plating apparatus resulting in failing to provide the function and an enlarged pore size of the diaphragm resulting in deterioration of separation performance of the membrane.

Figure 8:
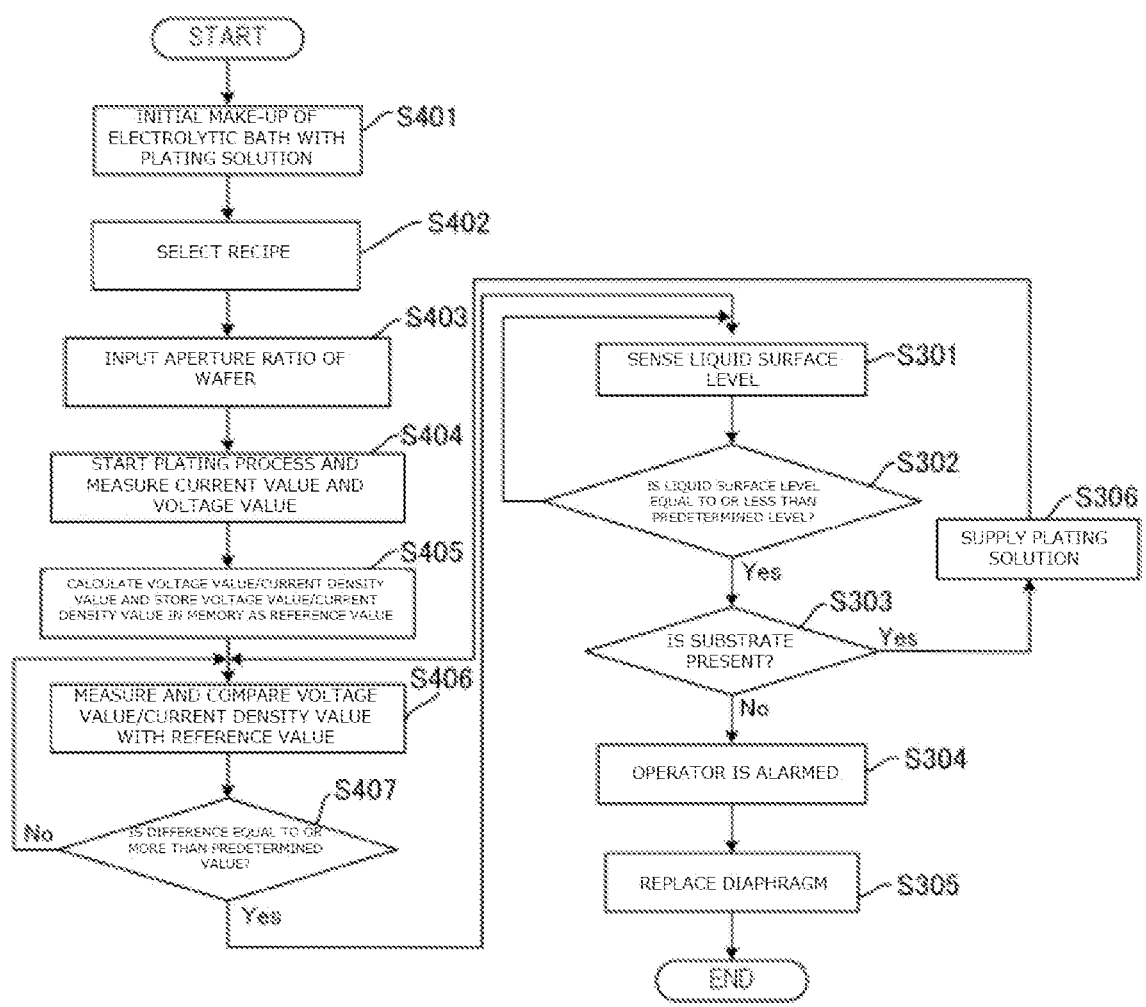
FIG. 8 is a drawing illustrating a flow of a process to replace the diaphragm based on the ratio of the voltage value to the current density value during plating and the liquid surface level of the plating solution in the anode bath.

FIG. 8 is a drawing illustrating a flow of a process to replace the diaphragm 26 based on the ratio of the voltage value to the current density value during plating and the liquid surface level of the plating solution Q1 in the anode bath 20. As illustrated in FIG. 8, in this process flow, Step S401 to Step S407 illustrated in FIG. 5 are performed first. At Step S407, when it is determined that the above-described calculated difference is equal to or more than the predetermined value (Step S407: Yes), the diaphragm 26 is regarded as possibly abnormal and subsequently the liquid surface level is confirmed.

Subsequently, Step S301 to Step S306 described in FIG. 4 are performed. When it is determined that the substrate Wf is absent in the cathode bath 30 at Step S303 (Step S303: No), the operator is alarmed at the determination by the alarm device 92 (Step S304). The operator determines that the diaphragm 26 is abnormal from the second alarm by the alarm device 92 and replaces the diaphragm 26 together with the anode bath 20 (Step S305).

In the process illustrated in FIG. 8, the ratio of the voltage value to the current density value and the liquid surface level are regularly monitored. Accordingly, when the presence/absence of abnormality in the diaphragm 26 is desired to be frequently confirmed, the presence/absence of abnormality in the diaphragm 26 can be quickly confirmed by the process illustrated in FIG. 8. The rapid change in the ratio of the voltage value to the current density value is possibly caused by a change in a constituent in the liquid or the like, not only by abnormality in the diaphragm 26. In view of this, it is difficult to reliably determine the presence/absence of abnormality in the diaphragm 26 only from the ratio of the voltage value to the current density value. In the process illustrated in FIG. 8, thus performing the process of FIG. 4 in addition to the process of FIG. 5 and then determining the replacement timing of the diaphragm 26 allow further accurately determining whether the diaphragm 26 comes to the replacement timing or not. Thus, this embodiment allows an In-situ evaluation at the appropriate timing even when the state of the diaphragm 26 is difficult to be determined by only a so-called visual check, such as a change in a surface chemical species of the diaphragm 26 installed in the plating apparatus resulting in failing to provide the function and an enlarged pore size of the diaphragm resulting in deterioration of separation performance of the membrane.

Figure 9:
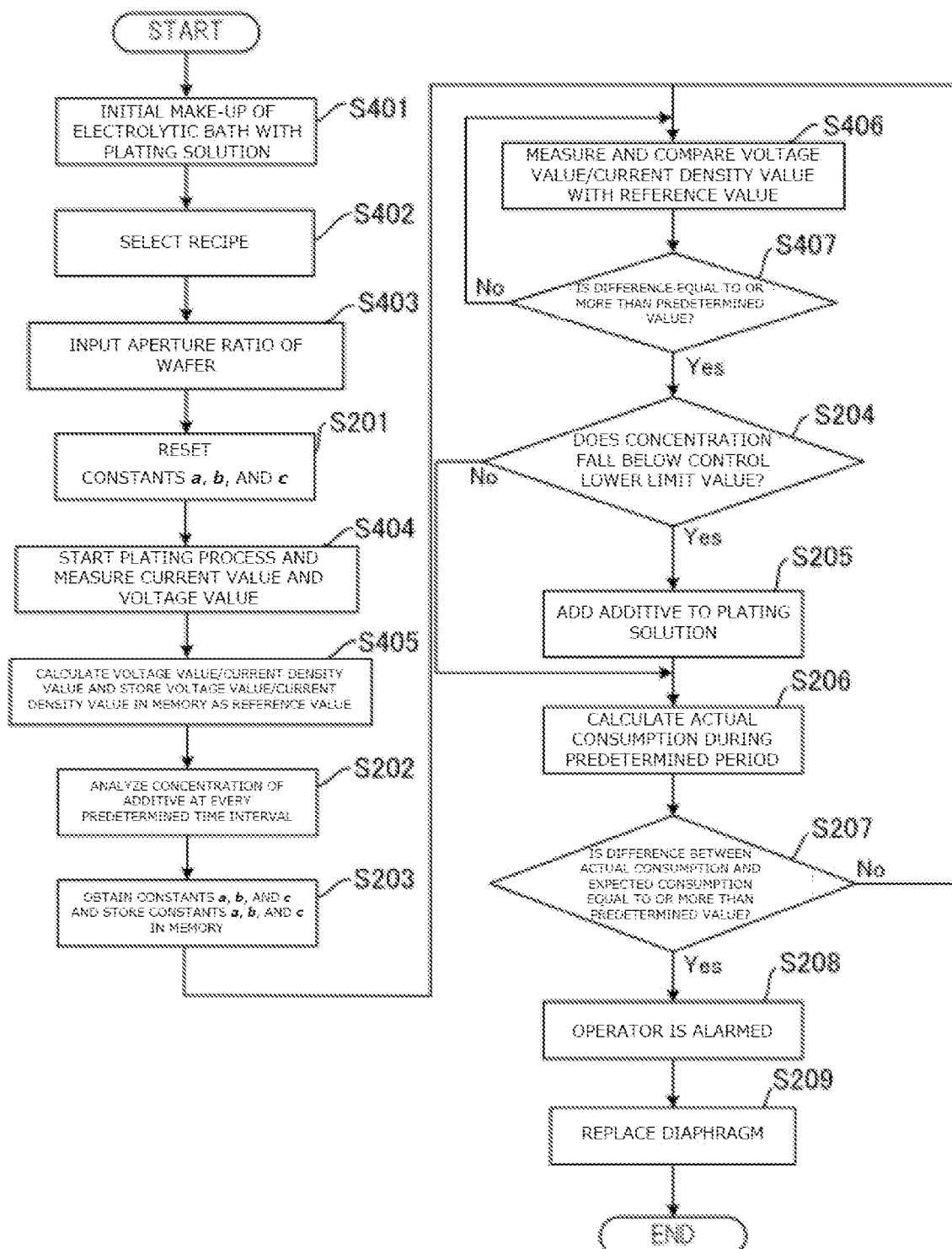
FIG. 9 is a drawing illustrating a flow of a process to replace the diaphragm based on the ratio of the voltage value to the current density value during plating and the concentration of the additive in the plating solution.

FIG. 9 is a drawing illustrating a flow of a process to replace the diaphragm 26 based on the ratio of the voltage value to the current density value during plating and the concentration of the additive in the plating solution Q2. As illustrated in FIG. 9, in this process flow, Step S401 to Step S403 illustrated in FIG. 5 and Step S201 described in FIG. 3 are performed first before the plating process. Subsequently, Step S404 and Step S405 described in FIG. 5 and Step S202 and Step S203 described in FIG. 3 are performed. At this time, Step S202 and Step S203 may be performed simultaneously with or before Step S404 and Step S405.

Subsequently, Step S406 to Step S408 described in FIG. 5 are performed. When the above-described calculated difference is determined as equal to or more than the predetermined value at Step S407 (Step S407: Yes), the diaphragm 26 is regarded as possibly abnormal, and the process further moves to a step of confirming the state of the diaphragm 26 based on the concentration of the additive in the plating solution Q2.

Subsequently, Step S204 to Step S209 described in FIG. 3 are performed. At Step S207, when it is determined that the difference between the actual consumption and the expected consumption is equal to or more than the predetermined value (Step S207: Yes), the operator is alarmed at the determination by the alarm device 92 (Step S208). The operator determines that the diaphragm 26 is abnormal from the second alarm by the alarm device 92 and replaces the diaphragm 26 together with the anode bath 20 (Step S209).

The process flow illustrated in FIG. 9 differs from the process flow illustrated in FIG. 7 in that Step S406 to Step S408 are performed and after that Step S204 to Step S207 are performed. The frequency of measuring the actual consumption of the additive at Step S206 is usually around once a day. In contrast to this, the voltage value and the current density value are measured more frequently at Step S406. In view of this, the first alarm is comparatively quickly performed by monitoring measurements of the voltage value and the current density value in advance; therefore, the change (abnormality) in the diaphragm 26 can be quickly found. Accordingly, when the presence/absence of abnormality in the diaphragm 26 is desired to be frequently confirmed, the presence/absence of abnormality in the diaphragm 26 can be quickly confirmed by the process illustrated in FIG. 9. The rapid change in the ratio of the voltage value to the current density value is possibly caused by a change in a constituent in the liquid or the like, not only by abnormality in the diaphragm 26. In view of this, it is difficult to reliably determine the presence/absence of abnormality in the diaphragm 26 only from the ratio of the voltage value to the current density value. In the process illustrated in FIG. 8, thus performing the process of FIG. 3 in addition to the process of FIG. 5 and then determining the replacement timing of the diaphragm 26 allow further accurately determining whether the diaphragm 26 comes to the replacement timing or not. Thus, this embodiment allows an In-situ evaluation at the appropriate timing even when the state of the diaphragm 26 is difficult to be determined by only a so-called visual check, such as a change in a surface chemical species of the diaphragm 26 installed in the plating apparatus resulting in failing to provide the function and an enlarged pore size of the diaphragm resulting in deterioration of separation performance of the membrane.

Note that the execution of at least one process among the processes illustrated in FIG. 3 to FIG. 9 allows determining the replacement timing of the diaphragm 26 and replacing the diaphragm 26 at the appropriate timing. Concurrent execution of all processes illustrated in FIG. 3 to FIG. 5 allows further accurate determination of the replacement timing of the diaphragm 26 and also allows evaluation for soundness of the plating apparatus 10.

Next, the following describes a regeneration process and a cleaning process of the diaphragm 26 when the diaphragm 26 causes the clogging or similar abnormality through the execution of the plating process by the plating apparatus 10 illustrated in FIG. 1. In the case where the diaphragm 26 is not replaced even after the execution of the processes illustrated in FIG. 3 to FIG. 9, there may be a case where the diaphragm 26 is clogged. Especially, in the case where the anode is the soluble anode and the diaphragm 26 is the cation exchange membrane, the diaphragm 26 is likely to be clogged. In this embodiment, an apparatus that cleans or regenerates the diaphragm 26 can be disposed. The "regeneration" process of the diaphragm 26 here means a process to resolve the clogging of the clogged diaphragm 26.

Figure 10:
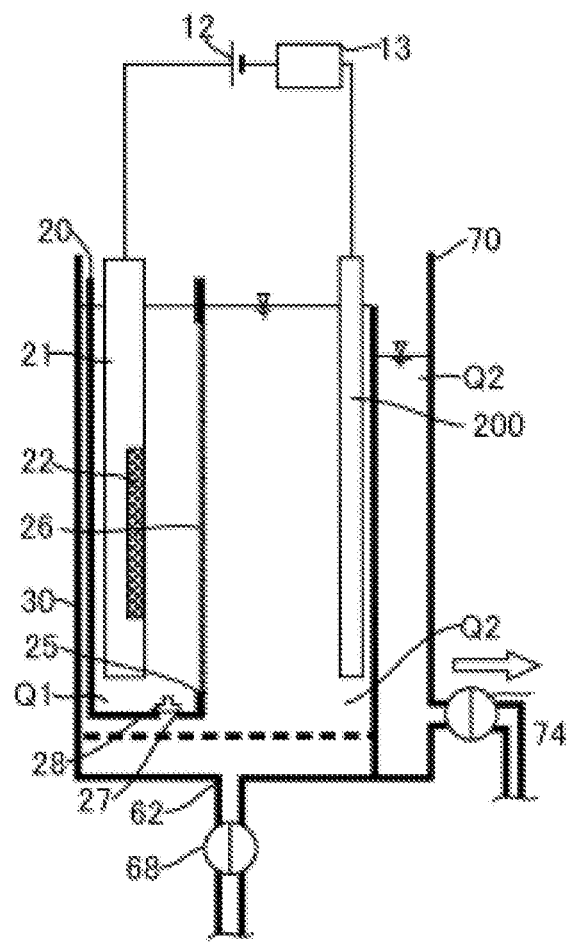
FIG. 10 is a schematic cross-sectional side view of the plating apparatus including a mechanism that regenerates the diaphragm.

FIG. 10 is a schematic cross-sectional side view of the plating apparatus 10 including a mechanism that regenerates the diaphragm 26. The plating apparatus 10 illustrated in FIG. 10 is different from the plating apparatus 10 illustrated in FIG. 1 in the internal structures of the cathode bath 30 and the anode bath 20, and the other parts are similar to those of the plating apparatus 10 illustrated in FIG. 1. Illustrations of components not directly related to the apparatus regenerating the diaphragm are omitted. The diaphragm 26 in FIG. 10 is the cation exchange membrane. As illustrated in FIG. 10, the plating apparatus 10 includes an electrode 200 (equivalent to one example of a first electrode) immersed in the plating solution Q2 (equivalent to one example of a first electrolyte) in the cathode bath 30 instead of the substrate Wf.

One possible cause of the clogging of the diaphragm 26 is that, the entire constituent in which the additive is decomposed is electrically charged or a polarity of a part of the constituent is charged and this results in electrostatic absorption of mutual ions of the constituent and the diaphragm 26. The chemical species with a high possibility of causing the membrane to clog and being likely to be adsorbed to the membrane is a chemical species that has an electric charge opposite to that of a functional group present in the diaphragm 26. Here, the clogging includes both of an electrostatic absorption of a substance to the membrane and a physical capture of the substance to holes on the membrane. Therefore, the plating apparatus illustrated in FIG. 10 removes the ions adsorbed to the diaphragm 26 by electrolysis. Specifically, to regenerate the diaphragm 26, the power supply 12 applies a voltage between the insoluble anode 22 (equivalent to one example of a second electrode), which is immersed in the plating solution Q1 (equivalent to one example of a second electrolyte), and the electrode 200 such that a current in a direction opposite to a direction during the plating process flows between the insoluble anode 22 and the electrode 200. In other words, since the insoluble anode 22 becomes a positive electrode during the plating process, a negative voltage is applied to the insoluble anode 22 and a positive voltage is applied to the electrode 200 to regenerate the diaphragm 26. This removes the ions attached to the diaphragm 26, thus resolving the clogging of the diaphragm 26. Instead of the insoluble anode 22, any electrode may be immersed in the plating solution Q1 and a voltage may be applied between this electrode and the electrode 200. A clogging derived from particles physically captured by the holes on the diaphragm 26 may be removed by removing the constituent adsorbed to the diaphragm 26 by electrolysis and then spouting a gas such as air from a nozzle (not illustrated) to the surface of the diaphragm 26. Thus performing the two removal processes on the diaphragm 26 allows further reliably resolving the clogging of the diaphragm 26.

Figure 11:
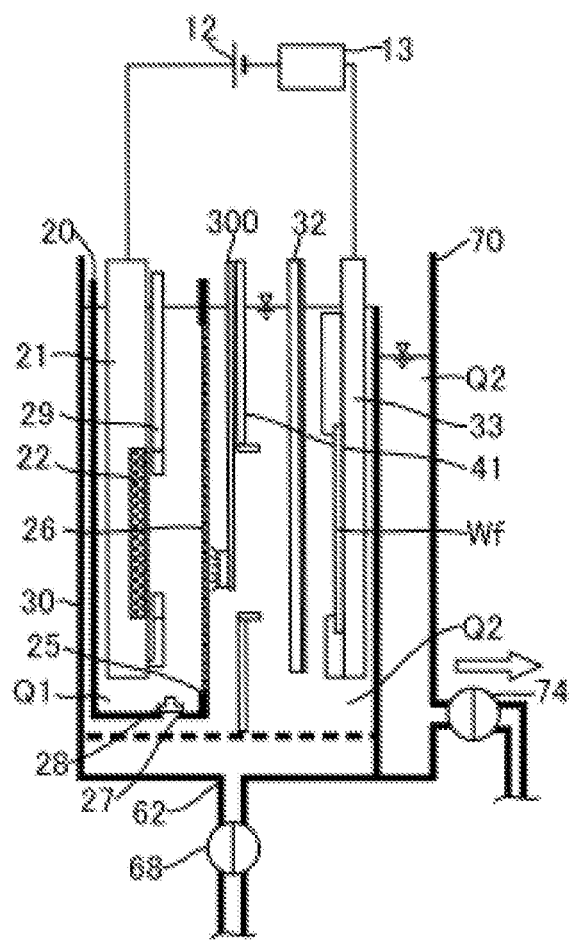
FIG. 11 is a schematic cross-sectional side view of the plating apparatus including a mechanism that regenerates the diaphragm.

FIG. 11 is a schematic cross-sectional side view of the plating apparatus 10 including a mechanism that regenerates the diaphragm 26. The plating apparatus 10 illustrated in FIG. 11 is different from the plating apparatus illustrated in FIG. 1 in the internal structures of the cathode bath 30 and the anode bath 20, and the other parts are similar to those of the plating apparatus illustrated in FIG. 1. Illustrations of components not directly related to the apparatus regenerating the diaphragm are omitted. The diaphragm 26 in FIG. 11 is the neutral diaphragm. Here, one possible cause of the clogging of the diaphragm 26 is that a component, such as a residual component of a resist derived from a substrate, present as particles in the liquid attaches to or is adsorbed to the diaphragm 26. Therefore, as illustrated in FIG. 11, the plating apparatus 10 includes a jet pipe 300 to spout a gas such as air to the surface of the diaphragm 26. Spouting the gas to the surface of the diaphragm 26 physically removes the substance attaching to the surface of the diaphragm 26. While in the example illustrated in the drawing, the jet pipe 300 is located so as to spout the gas from the cathode bath 30 to the surface of the diaphragm 26, the jet pipe 300 may be movably configured so as to spout the gas from the anode bath 20 to the surface of the diaphragm 26. Alternatively, two or more jet pipes 300 may be disposed at the plating apparatus 10 so as to spout the gas from both sides of the diaphragm 26. Alternatively, the clogging derived from particles attaching to the diaphragm 26 may be removed by spouting the gas such as air to the surface of the diaphragm 26 and then the charged constituent adsorbed to the diaphragm 26 may be removed by electrolysis. By thus performing the two removal processes on the diaphragm 26 can further reliably resolve the clogging of the diaphragm 26.

While the above-described working example employs the neutral diaphragm as the diaphragm 26, this neutral diaphragm may employ a known membrane such as a membrane having the maximum hole diameter of 0.1 μm similar to those of PTFE (polytetrafluoroethylene) membrane type and PSU membrane type filters (collection rate of a solid material with a size of 0.1 μm or more: 99.99%), or a membrane with the maximum hole diameter of 0.8 μm or less formed of a base material made of, for example, an acid-resistant resin such as a PP fiber and a PVDF fiber and a PET resin, for example, an electrolytic diaphragm for plating manufactured by Yuasa Membrane Systems Co., Ltd.

Figure 12:
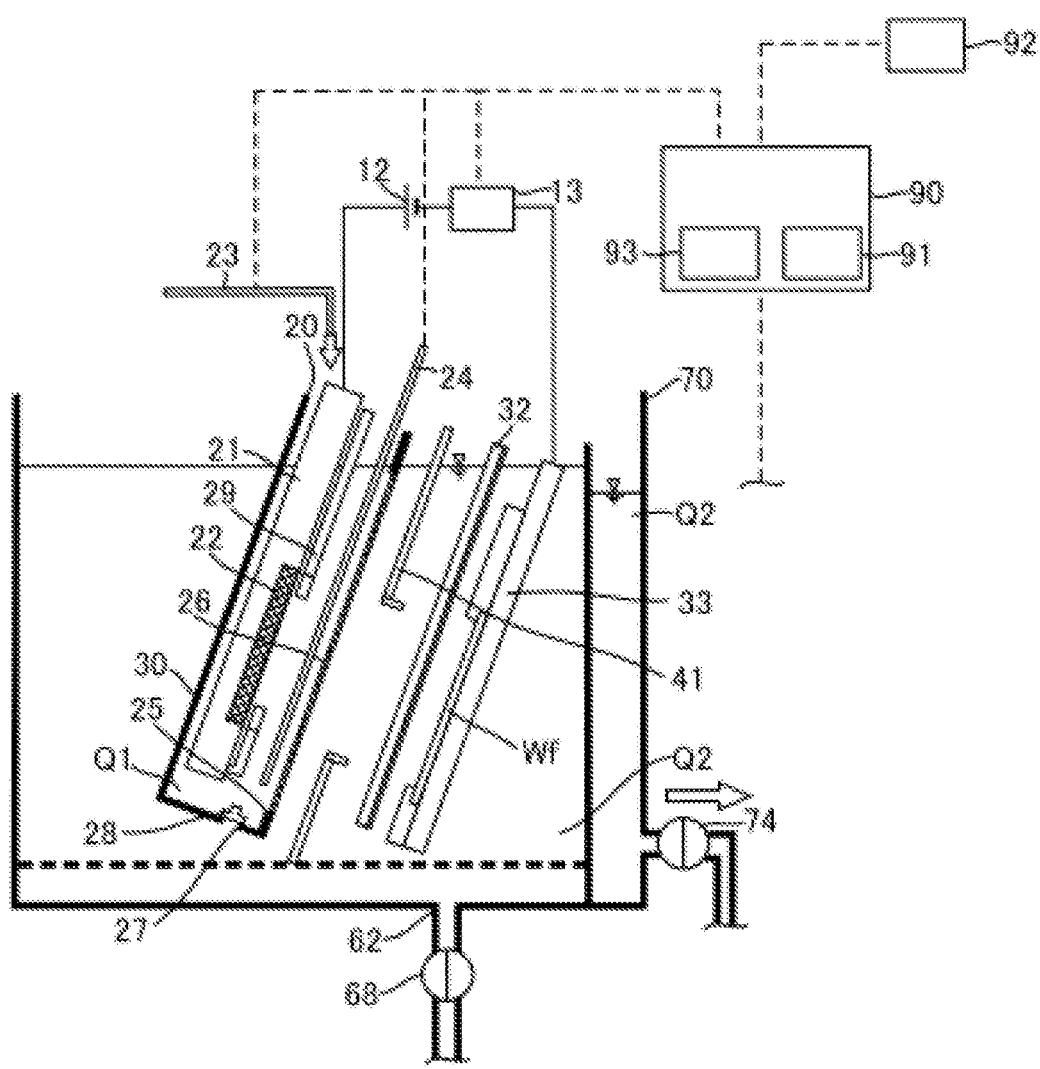
FIG. 12 is a schematic cross-sectional side view illustrating the plating apparatus according to another embodiment.

Next, the following describes another embodiment of the plating apparatus illustrated in FIG. 1. FIG. 12 is a schematic cross-sectional side view illustrating the plating apparatus according to another embodiment. A concentration gradient of medicinal solution concentration in the plating solution is possibly formed in a vertical direction. In view of this, as illustrated in the drawing, components such as the substrate Wf located in the cathode bath 30 are inclined in the plating apparatus 10 of this embodiment. Thus inclining the components located in the cathode bath 30 ensures reducing an influence from the gradient of the medicinal solution concentration. Additionally, the inclination of the substrate Wf facilitates exiting voids attaching to the substrate Wf upward. Such plating apparatus 10 also ensures performing the process illustrated in FIG. 3 to FIG. 9.

Figure 13:
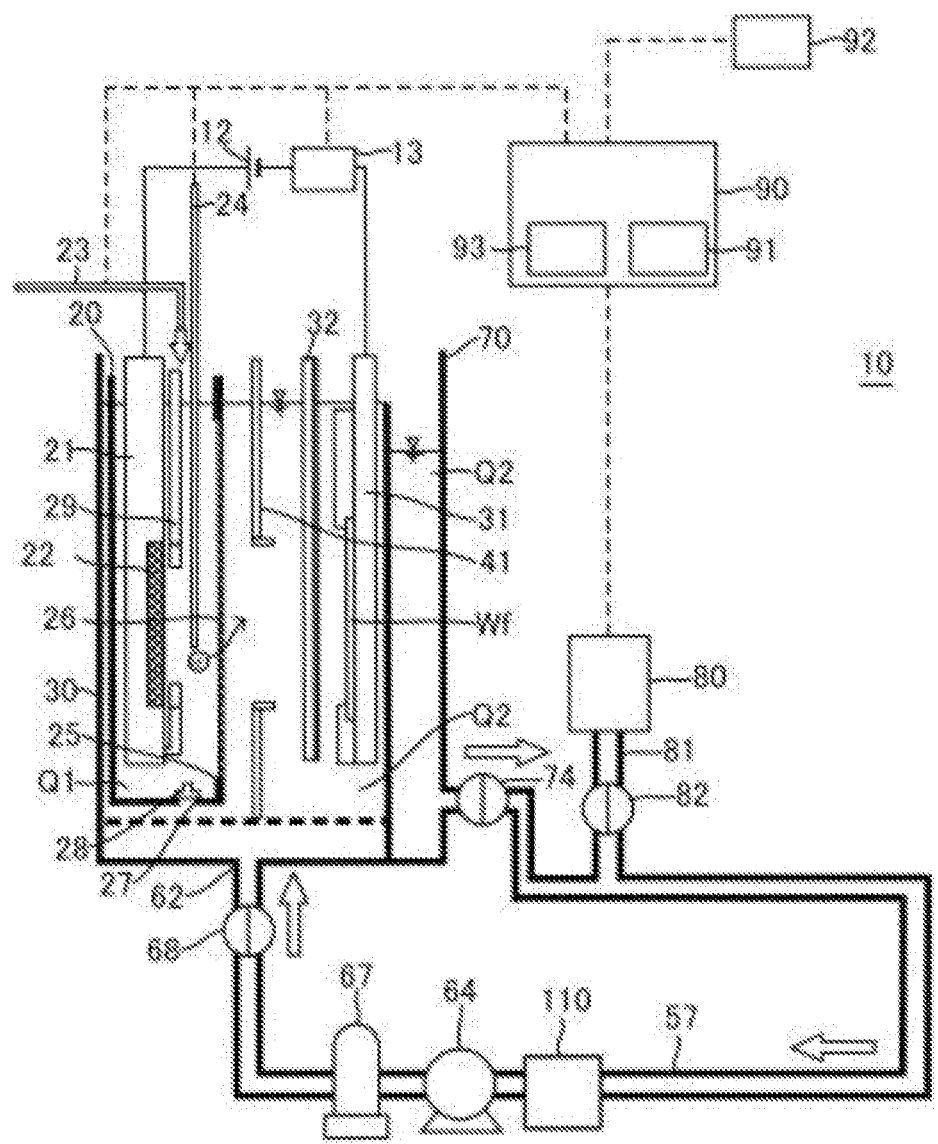
FIG. 13 is a schematic cross-sectional side view illustrating the plating apparatus according to yet another embodiment.

FIG. 13 is a schematic cross-sectional side view illustrating the plating apparatus according to yet another embodiment. The plating apparatus 10 illustrated in FIG. 13 uses a cation exchange membrane as the diaphragm 26. Since this cation exchange membrane includes a functional group ($-SO_3^-$, $-COO^-$, $-PO_3^{2-}$, $-PO_3H^-$, and $C_6H_4O^-$) negatively charged in the membrane on the surface, the cation exchange membrane is configured to prevent ions negatively charged electrically and a polar substance partially negatively charged from passing through the cation exchange membrane. Furthermore, the cation exchange membrane is configured such that ions (for example, metal ions) positively charged electrically are passable. As this membrane, for example, Neosepta (registered trademark) membrane (ionic character) manufactured by ASTOM Corporation, Nafion (registered trademark) membrane manufactured by DuPont, or similar membrane is usable. As the anode, a soluble anode 22' made of, for example, phosphorus-containing copper is used. Accordingly, the metal ions such as copper ions are dissolved from the soluble anode 22' in the plating solution Q1 and supplied to the plating solution Q2 via the diaphragm 26. This eliminates the need for the supply device 50 illustrated in FIG. 1. In view of this, the plating solution Q2 in the overflow bath 70 is circulated around the cathode bath 30 via the supply pipe 57. This plating apparatus 10 further includes a thermostat 110 to maintain the circulated plating solution Q2 at a predetermined temperature.

The analyzer 80 analyzes the concentration of the copper ions in the plating solution Q2 in the cathode bath 30 at, for example, every predetermined time interval. The concentration of the copper ions analyzed by the analyzer 80 is transmitted to the control device 90. When the diaphragm 26 is clogged in this plating apparatus 10, as illustrated in FIG. 10, the electrode 200 is immersed in the cathode bath 30 instead of the substrate Wf, and a voltage is applied between the soluble anode 22 and the electrode 200, thus allowing the regeneration of the diaphragm 26. Alternatively, as illustrated in FIG. 11, the jet pipe 300 is located in the cathode bath 30 or in the anode bath 20, thus allowing spouting the gas to the surface of the diaphragm 26 to clean the diaphragm 26.

Figure 14:
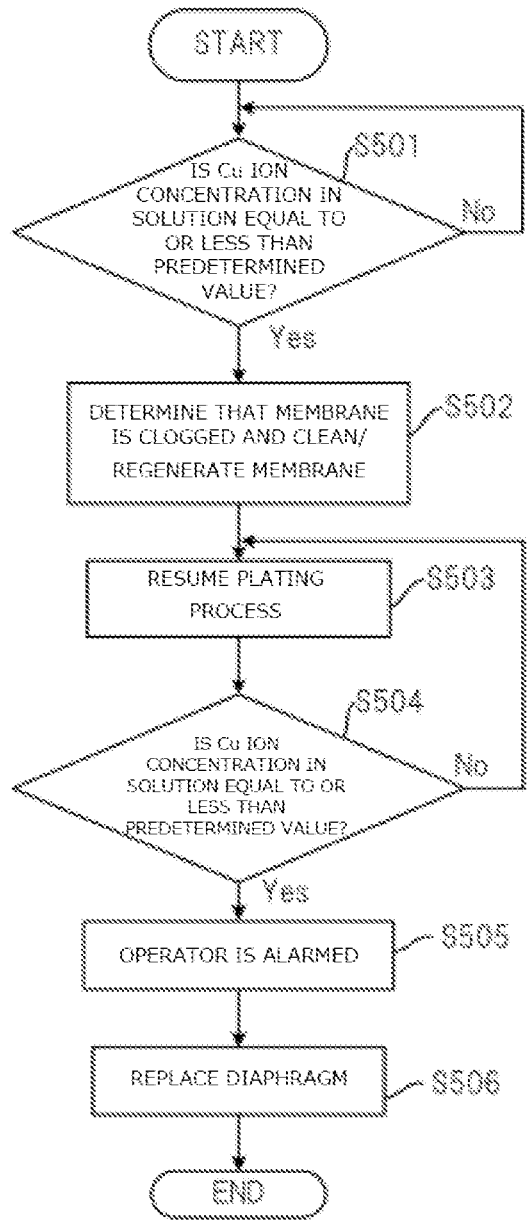
FIG. 14 is a drawing illustrating a flow to clean or regenerate the diaphragm in the plating apparatus illustrated in FIG. 13.

FIG. 14 illustrates a flow to clean or regenerate the diaphragm 26 in the plating apparatus 10 illustrated in FIG. 13. First, the control device 90 determines whether the copper ion concentration of the solution in the cathode bath 30 received from the analyzer 80 is equal to or less than a predetermined value or not (Step S501). When the copper ion concentration is determined as equal to or less than the predetermined value (Step S501: Yes), this means that copper ions $M^+$ dissolved from the soluble anode 22' in the plating solution Q1 do not sufficiently pass through the diaphragm 26 and therefore do not move to the plating solution Q2. In view of this, the control device 90 determines that the diaphragm 26 is clogged and performs the regeneration or the cleaning process on the diaphragm 26. The regeneration or the cleaning process of the diaphragm 26 can be performed by the method described related to FIG. 10 and FIG. 11 as described above.

Subsequently, when the regeneration or the cleaning process is performed on the diaphragm 26 at Step S502, the plating process is resumed (Step S503). After the elapse of a predetermined period, the analyzer 80 analyzes the concentration of the copper ions in the plating solution Q2 in the cathode bath 30 again and transmits the analyzed concentration of the copper ions to the control device 90. The control device 90 determines whether the copper ion concentration of the solution in the cathode bath 30 received from the analyzer 80 is equal to or less than the predetermined value or not (Step S504). When the copper ion concentration is determined as not equal to or less than the predetermined value (Step S504: No), the plating process is resumed (continued) (Step S503).

When the copper ion concentration is determined as equal to or less than the predetermined value (Step S504: Yes), it is considered that the clogging of the diaphragm 26 is not dissolved or an abnormality other than the clogging occurs in the diaphragm 26. Accordingly, the operator is alarmed that the diaphragm 26 is abnormal by the alarm device 92 (Step S505). The operator knows that the diaphragm 26 is abnormal by the alarm from the alarm device 92 and replaces the diaphragm 26 together with the anode bath 20 (Step S506).

Generally, a frequency to replace the liquid in accordance with aging of the plating solution is more frequent than a frequency to replace the diaphragm 26 in accordance with the progress of deterioration of the diaphragm 26 used for the plating process. Conventionally, for evaluation of the state of the diaphragm 26 during the plating process, it was necessary to take out the diaphragm 26 outside the plating apparatus 10. To uniformly form the plating film on the substrate Wf in the plating apparatus 10, it is preferred that the positions of the substrate Wf, the anode, and the regulation plate 41 are on an identical straight line and the substrate Wf, the anode, and the regulation plate 41 are parallel to one another. Here, when the diaphragm 26 is attempted to be taken out outside the plating apparatus 10 in the middle of the successive plating processes on the substrate Wf, the positional relationship between the substrate Wf, the anode, and the regulation plate 41 is displaced each time, and therefore the relative positions of the respective components need to be adjusted (so-called alignment) again. This adjustment takes a labor and a comparatively long time. Taking out the diaphragm 26 outside the apparatus only for confirmation of the state of the diaphragm 26 and directly confirming the diaphragm 26 are not preferred from an aspect of securing the operating period of the plating apparatus 10 as long as possible. In view of this, conventionally, evaluating the state of the diaphragm 26 in the middle of the successive plating processes for evaluation of the wear level of the diaphragm 26 was difficult when a throughput of the plating apparatus 10 was taken into consideration.

Meanwhile, this embodiment allows the In-situ confirmation of the wear level and the state of the diaphragm 26 installed in the plating apparatus 10. This eliminates the need for taking out the diaphragm 26 from the plating bath and confirming the state by visual check. This embodiment allows the evaluation of the state of the diaphragm 26 difficult to be determined by only a so-called visual check, such as a change in a surface chemical species of the diaphragm 26 resulting in failing to provide the function and an enlarged pore size of the diaphragm resulting in deterioration of separation performance of the membrane.

Figure 15:
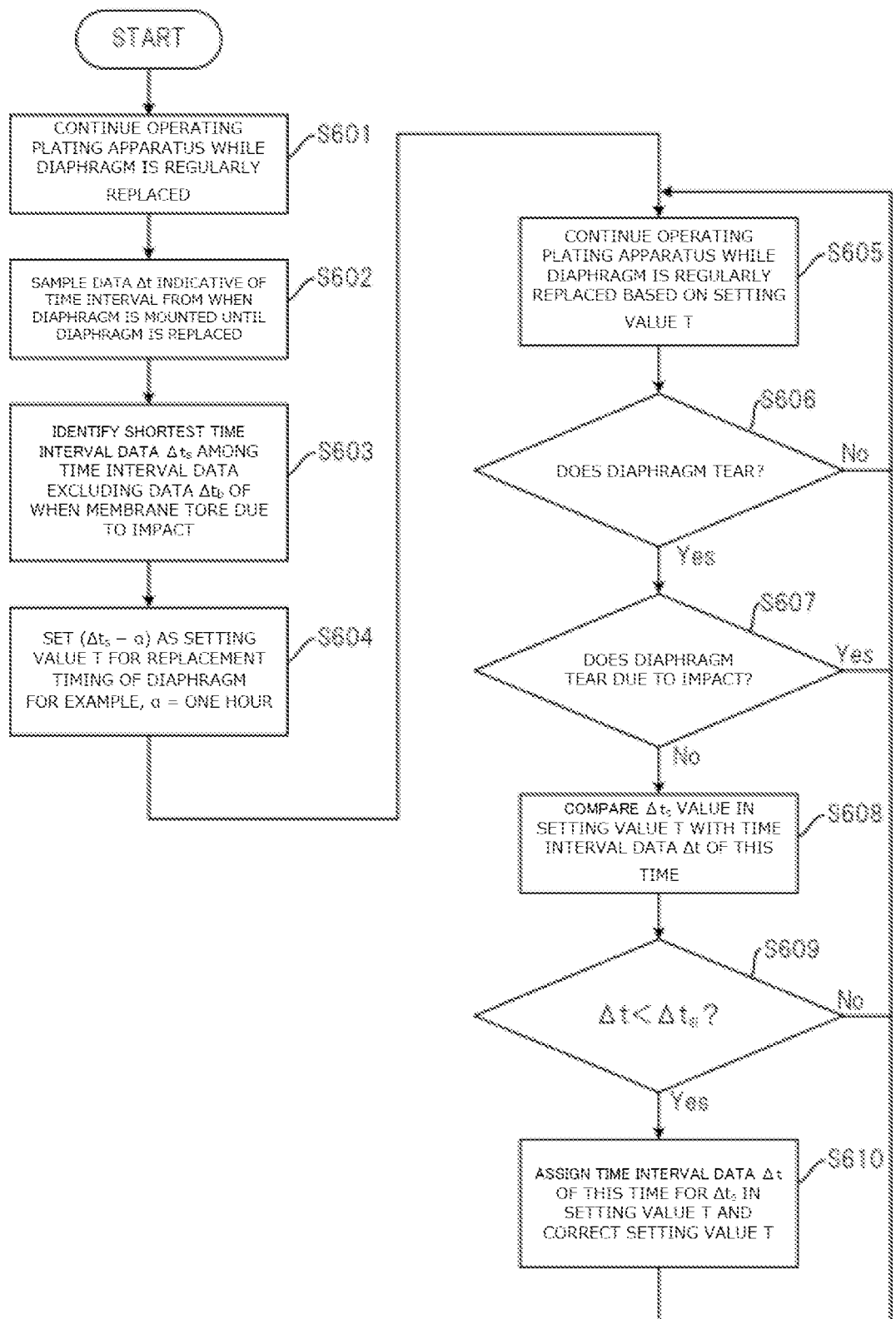
FIG. 15 is a flow illustrating a method to predict a life of the diaphragm.

Thus, this embodiment allows accurately identifying the replacement timing of the diaphragm 26 through the evaluation for the state of the diaphragm 26. Therefore, in this embodiment, the accumulation of data regarding the replacement timing of the diaphragm 26 allows predicting the replacement timing of the diaphragm 26 based on the accumulated data. Thus, replacing the diaphragm 26 based on the predicted replacement timing of the diaphragm 26 allows replacing the diaphragm 26 at the appropriate timing before the diaphragm 26 comes to the end of life due to wear. This ensures continuing the plating process while preventing abnormal plating. FIG. 15 is a flow illustrating the method to predict the life of the diaphragm 26. The flow illustrated in FIG. 15 is performed by controlling the respective units of the plating apparatus 10 by the control device 90 illustrated in FIG. 1.

As illustrated in FIG. 15, first, with the plating apparatus 10 including the diaphragm 26, the plating apparatus 10 is continuously operated while the diaphragm 26 is regularly replaced in accordance with the flow illustrated in any of FIG. 3 to FIG. 9 (Step S601). The control device 90 records data Δt indicative of a time interval from when the diaphragm 26 is mounted to the plating apparatus 10 until the diaphragm 26 is replaced in the memory 91 (Step S602). The operation of the plating apparatus 10 is successively continued using, for example, an identical plating bath for around 30 days. In this case, there may be a case where the plating conditions become different over time and the diaphragm 26 tears due to a physical impact. Additionally, the measured data possibly vary in terms of statistics. In view of this, the data Δt of the replacement timing of the diaphragm 26 vary.

Subsequently, the control device 90 identifies the shortest time interval data $\Delta t_s$ among the plurality of time interval data Δt from which time interval data $\Delta t_b$ of when the diaphragm 26 was replaced in the case where the diaphragm 26 tore due to an impact has been excluded (Step S603). In the case where the physical impact tears the diaphragm 26, the diaphragm 26 is replaced in accordance with the flow illustrated in any of FIG. 3 to FIG. 9. However, to predict the life of the diaphragm 26, it is important to exclude the data when the diaphragm 26 becomes the abnormal state due to such incidental reason.

The control device 90 sets ($\Delta t_s - \alpha$) as a setting value T for the replacement timing of the diaphragm 26. Here, the initial setting value of α may be zero or can be set to, for example, one hour. Compared with the length of the period for continuous operation of the plating apparatus 10, a magnitude of α becomes actually negligible. Thus setting the setting value T allows replacing the diaphragm 26 at a time interval simultaneously with or a little earlier than the shortest time interval data $\Delta t_s$ of when the diaphragm 26 was replaced in the past, thereby ensuring replacing the diaphragm 26 before the diaphragm 26 comes to the end of life.

The control device 90 continues operating the plating apparatus 10 while the diaphragm 26 is regularly replaced in accordance with the flow illustrated in any of FIG. 3 to FIG. 9 based on the setting value T set at Step S604. That is, when the diaphragm 26 is determined as abnormal based on the flow illustrated in any of FIG. 3 to FIG. 9, the diaphragm 26 is replaced, or when the period from when the diaphragm 26 is replaced comes to the setting value T, the diaphragm 26 is regarded as coming to the end of life and the diaphragm 26 is replaced.

Subsequently, while the control device 90 continues operating the plating apparatus 10 while the diaphragm 26 is regularly replaced at Step S605, the control device 90 determines whether the diaphragm 26 tears or not (Step S606). When, for example, the diaphragm 26 is replaced in accordance with the flow illustrated in FIG. 4, the control device 90 can determine that the diaphragm 26 has torn. When the control device 90 determines that the diaphragm 26 is not torn (Step S606: No), the process returns to Step S605 and the plating apparatus 10 continues operating.

When the control device 90 determines that the diaphragm 26 tears at Step S606 (Step S606: Yes), whether this tear occurred due to an impact or not is subsequently determined (Step S607). When it is determined that the tear of the diaphragm 26 was caused by the impact (Step S607: Yes), the process returns to Step S605 and the plating apparatus 10 continues operating. Meanwhile, when it is determined that the tear of the diaphragm 26 was not caused by an impact (Step S607: No), it is presumed that the diaphragm 26 tore due to the end of life. Therefore, the control device 90 compares the time interval data Δt from when the diaphragm 26 was replaced until the diaphragm 26 tore with Δt included in the setting value T (Step S608).

The control device 90 determines whether the data Δt is less than the data Δt or not (Step S609). Here, when the data Δt is less than the data Δt (Step S609: Yes), this indicates that the data Δt indicative of the time interval from when the diaphragm 26 is mounted until the diaphragm 26 is replaced is the minimum among the time intervals up to the present. Therefore, the data Δt is assigned for Δt included in the setting value T and the setting value T is corrected (Step S610). Afterwards, the process returns to Step S605 and the plating apparatus 10 continues operating. This allows appropriately correcting the setting value T. Additionally, the diaphragm 26 can be replaced at the time interval simultaneous with or a little earlier than the shortest time interval data Δt of when the diaphragm 26 was replaced in the past. When the data Δt is not less than the data $\Delta t_s$ (Step S609: No), the setting value T is not corrected, the process returns to Step S605, and the plating apparatus 10 continues operating.

As described above, this embodiment allows replacing the diaphragm 26 at the appropriate timing before the diaphragm 26 comes to the end of life due to wear. Accordingly, abnormal plating due to abnormality in the diaphragm 26 can be prevented. Note that such device performing an arithmetic operation to determine the life of the diaphragm 26 may be the above-described control device 90, which is disposed for controlling the plating apparatus 10, or may be an arithmetic device disposed only for execution of the flow illustrated in FIG. 15.

The embodiment of the present invention has been described above in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited. As a modification, for example, in a plating apparatus where components located in the cathode unit such as the substrate Wf are installed horizontally, an anode holder located in an anode unit, which is disposed separately from the cathode unit and houses an insoluble anode and plating solution, is similarly installed horizontally, and surfaces where these anode unit and cathode unit are in contact with one another are covered with a diaphragm, the state of this diaphragm is monitored using the method of the present invention to ensure the determination of the replacement timing of the diaphragm in this plating apparatus by the method of the present invention.

As another modification, there can be provided a plating method that plates a substrate by a plating apparatus. The plating apparatus separates a plating solution in an anode unit housing an insoluble anode from a plating solution containing an additive in a cathode unit housing the substrate with a diaphragm. This plating method includes: a step of sensing a liquid surface level of the plating solution in the anode unit; a step of determining whether the liquid surface level is equal to or less than a predetermined level or not; a step of determining whether the substrate is present in the cathode unit or not; a step of determining that the substrate is absent in the cathode unit and the liquid surface level is equal to or less than the predetermined level; a step of measuring a current value and a voltage value during the plating of the substrate; a step of determining whether a difference between a ratio of the voltage value to a current density value calculated based on the current value and a reference value is equal to or more than a predetermined value or not; and a step of replacing the diaphragm when the difference is determined as equal to or more than the predetermined value. This allows the configuration that frequently inspects and determines the presence/absence of abnormality in the membrane while preventing a false sensing by two-stage confirmations.

The above-described various kinds of processes may be performed as follows. A readable recording medium records a program to perform a process of the control device 90 of the above-described embodiment, a computer system reads the program recorded in this recording medium, and a processor executes the program.

REFERENCE SIGNS LIST

10 . . . plating apparatus
13 . . . measuring device
20 . . . anode bath
22' . . . soluble anode
22 . . . insoluble anode
23 . . . DIW supply device
24 . . . liquid surface level sensor
25 . . . opening
26 . . . diaphragm
27 . . . hole
28 . . . valve
30 . . . cathode bath
80 . . . analyzer
90 . . . control device
91 . . . memory
92 . . . alarm device
Q1, Q2 . . . plating solution
Wf . . . substrate

The invention claimed is:

1. A plating method that plates a substrate by a plating apparatus, the plating apparatus separating a plating solution in an anode unit housing an anode from a plating solution containing an additive in a cathode unit housing the substrate with a diaphragm, the plating method comprising:
a step of analyzing a concentration of the additive in the plating solution in the cathode unit at every predetermined time interval;
a step of calculating an actual consumption of the additive during the predetermined period based on the concentration of the additive analyzed at the every predetermined time interval;
a step of determining whether a difference between an expected consumption and the actual consumption of the additive during the predetermined period is equal to or more than a predetermined value or not;
a step of sensing a liquid surface level of the plating solution in the anode unit when the difference between the expected consumption and the actual consumption is determined as equal to or more than the predetermined value;
a step of determining whether the liquid surface level is equal to or less than a predetermined level or not;
a step of determining whether the substrate is present in the cathode unit or not; and
a step of replacing the diaphragm when the substrate is determined as absent in the cathode unit and the liquid surface level is determined as equal to or less than the predetermined level.

2. A plating method that plates a substrate by a plating apparatus, the plating apparatus separating a plating solution in an anode unit housing an anode from a plating solution containing an additive in a cathode unit housing the substrate with a diaphragm, the plating method comprising:
a step of measuring a current value and a voltage value during the plating on the substrate;
a step of analyzing a concentration of the additive in the plating solution in the cathode unit at every predetermined time interval;
a step of calculating an actual consumption of the additive during the predetermined period based on the concentration of the additive analyzed at the every predetermined time interval;
a step of determining whether a difference between an expected consumption and the actual consumption of the additive during the predetermined period is equal to or more than a predetermined value or not;
a step of determining whether a difference between a ratio of the voltage value to a current density value calculated based on the current value and a reference value is equal to or more than a predetermined value or not when the difference between the expected consumption and the actual consumption is determined as equal to or more than the predetermined value; and
a step of replacing the diaphragm when the difference between the ratio and the reference value is determined as equal to or more than the predetermined value.

3. A plating method that plates a substrate by a plating apparatus, the plating apparatus separating a plating solution in an anode unit housing an insoluble anode from a plating solution containing an additive in a cathode unit housing the substrate with a diaphragm, the plating method comprising:
a step of measuring a current value and a voltage value during the plating on the substrate;
a step of determining whether a difference between a ratio of the voltage value to a current density value calculated based on the current value and a reference value is equal to or more than a predetermined value or not;
a step of sensing a liquid surface level of the plating solution in the anode unit when the difference is determined as equal to or more than the predetermined value;
a step of determining whether the liquid surface level is equal to or less than a predetermined level or not;
a step of determining whether the substrate is present in the cathode unit or not; and
a step of replacing the diaphragm when the substrate is determined as absent in the cathode unit and the liquid surface level is determined as equal to or less than the predetermined level.

4. A plating method that plates a substrate by a plating apparatus, the plating apparatus separating a plating solution in an anode unit housing an insoluble anode from a plating solution containing an additive in a cathode unit housing the substrate with a diaphragm, the plating method comprising:
a step of measuring a current value and a voltage value during the plating on the substrate;
a step of analyzing a concentration of the additive in the plating solution in the cathode unit at every predetermined time interval;
a step of determining whether a difference between a ratio of the voltage value to a current density value calculated based on the current value and a reference value is equal to or more than a predetermined value or not;
a step of calculating an actual consumption of the additive during the predetermined period based on the concentration of the additive analyzed at the every predetermined time interval when the difference is determined as equal to or more than the predetermined value;
a step of determining whether a difference between an expected consumption and the actual consumption of the additive during the predetermined period is equal to or more than a predetermined value or not; and
a step of replacing the diaphragm when the difference between the expected consumption and the actual consumption is determined as equal to or more than the predetermined value.

5. The plating method according to claim 2, comprising
a step of setting a value of the ratio of the voltage value to the current density value immediately after the diaphragm is replaced as the reference value.

6. The plating method according to claim 2, wherein
the step of replacing the diaphragm includes a step of replacing the diaphragm together with the anode unit.

7. The plating method according to claim 2, further comprising:
a step of determining a replacement timing of the diaphragm based on a plurality of data, the plurality of data indicating a time interval from when the diaphragm is mounted to the plating apparatus until the diaphragm is replaced; and
a step of replacing the diaphragm based on the replacement timing.

8. A recording medium storing a computer program, the computer program causing a plating apparatus to perform the plating method according to claim 2, wherein the plating method further includes:
- a step of determining a replacement timing of the diaphragm based on a plurality of data, the plurality of data indicating a time interval from when the diaphragm is mounted to the plating apparatus until the diaphragm is replaced; and
- a step of replacing the diaphragm based on the replacement timing.

* * * * *